United States Patent
Tokuda et al.

(10) Patent No.: US 10,561,014 B2
(45) Date of Patent: Feb. 11, 2020

(54) ELECTRONIC DEVICE

(71) Applicants: Kabushiki Kaisha Toshiba, Minato-ku, Tokyo (JP); Toshiba Electronic Devices & Storage Corporation, Minato-ku, Tokyo (JP)

(72) Inventors: Kota Tokuda, Kawasaki Kanagawa (JP); Nobuhiro Yamamoto, Yokohama Kanagawa (JP); Yousuke Hisakuni, Sagamihara Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/127,550

(22) Filed: Sep. 11, 2018

(65) Prior Publication Data
US 2019/0335581 A1   Oct. 31, 2019

(30) Foreign Application Priority Data
Apr. 25, 2018 (JP) .................................. 2018-084496

(51) Int. Cl.
| | |
|---|---|
| H05K 1/02 | (2006.01) |
| H05K 1/11 | (2006.01) |
| H05K 1/18 | (2006.01) |
| G11B 33/12 | (2006.01) |
| H05K 7/20 | (2006.01) |

(52) U.S. Cl.
CPC ......... *H05K 1/0281* (2013.01); *G11B 33/122* (2013.01); *H05K 1/118* (2013.01); *H05K 1/181* (2013.01); *H05K 1/189* (2013.01); *H05K 7/20509* (2013.01); *H05K 2201/056* (2013.01); *H05K 2201/068* (2013.01); *H05K 2201/09236* (2013.01); *H05K 2201/10409* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,065,280 A | * | 11/1991 | Karnezos | ............ H01L 23/4006 |
| | | | | 165/185 |
| 5,267,867 A | * | 12/1993 | Agahdel | ............. H01L 23/4006 |
| | | | | 257/E23.084 |

(Continued)

FOREIGN PATENT DOCUMENTS

| | | |
|---|---|---|
| JP | 62-008668 U | 1/1987 |
| JP | 07-336006 A | 12/1995 |
| JP | 2016-105436 A | 6/2016 |

*Primary Examiner* — William H. Mayo, III
*Assistant Examiner* — Krystal Robinson
(74) *Attorney, Agent, or Firm* — White & Case LLP

(57) ABSTRACT

According to one embodiment, an electronic device includes a flexible printed-wiring board which includes a first face and a second face, and is supported by the support member. One or more electronic components are mounted on the first face. The electronic device is fixed onto the second face. The flexible printed-wiring board includes a plurality of first regions, on which the one or more electronic components are mounted or to which a member secured on the support member is fixed. When viewed from a direction orthogonal to the first face, the plate is provided with an opening between two first regions of the plurality of first regions.

16 Claims, 16 Drawing Sheets

(56) References Cited

U.S. PATENT DOCUMENTS

| | | | |
|---|---|---|---|
| 9,007,779 B2* | 4/2015 | Yamamoto | G11B 25/043 361/752 |
| 2015/0301273 A1* | 10/2015 | Huang | G02B 6/0088 362/606 |
| 2016/0157350 A1 | 6/2016 | Yamamoto et al. | |

* cited by examiner

ELECTRONIC DEVICE

CROSS-REFERENCE TO RELATED APPLICATIONS

This application is based upon and claims the benefit of priority from Japanese Patent Application No. 2018-084496, filed on Apr. 25, 2018; the entire contents of which are incorporated herein by reference.

FIELD

Embodiments described herein relate generally to an electronic device.

BACKGROUND

Conventionally, electronic devices are known which include a flexible printed-wiring board onto which an electronic component is mounted and a plate is fixed, and a support member supporting the flexible printed-wiring board.

Stress concentration may occur on the wiring of such a flexible printed-wiring board.

DETAILED DESCRIPTION

Figure 1:
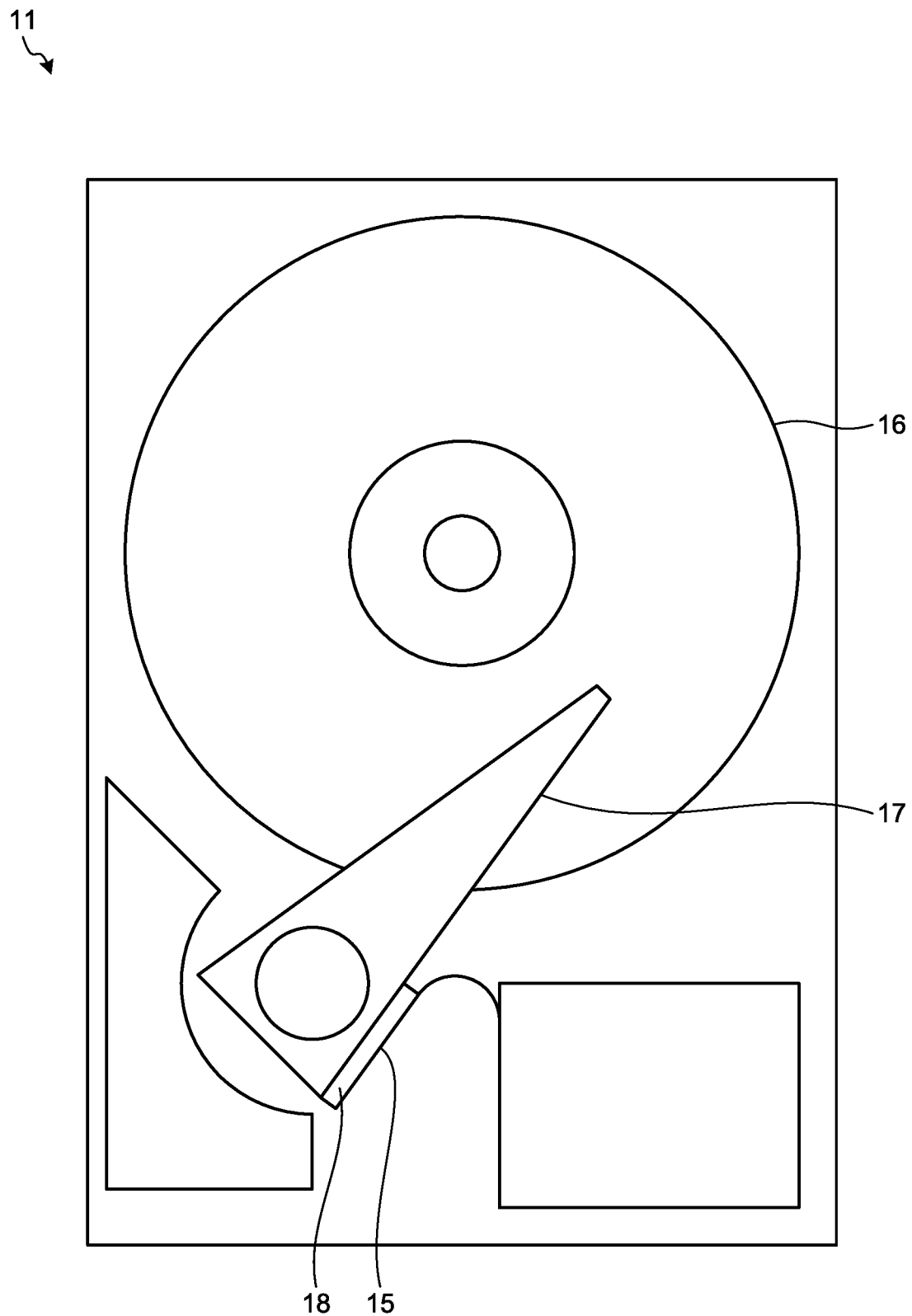
FIG. 1 is an exemplary and schematic view of a configuration of a hard disk drive of a first embodiment.

In general, according to one embodiment, an electronic device includes a support member, a flexible printed-wiring board, one or more electronic components, and a plate. The flexible printed-wiring board includes a first surface, a second surface opposite the first surface, and wiring, and is supported by the support member. The one or more electronic components are mounted on the first surface, and are electrically connected to the wiring. The plate is fixed onto the second surface. The flexible printed-wiring board includes a plurality of first regions, on which the electronic components are mounted or to which a member secured on the support member is fixed. When the plate is viewed from a direction orthogonal to the first surface, the plate is provided with an opening between two first regions of the plurality of first regions.

Hereinafter, the electronic device according to embodiments will be described in detail, with reference to the accompanying drawings. Configurations of embodiments described below, and actions and effects obtained by the configurations are merely exemplary and not intended to limit the scope of the present invention. Herein, ordinal numbers are used to distinguish components, parts, or elements, and do not indicate order or priority. The following embodiments include same or like elements. The same or like elements are denoted by common reference numerals, and overlapping description will be omitted.

First Embodiment

FIG. 1 is an exemplary and schematic view of a configuration of a hard disk drive 11 of a first embodiment. As illustrated in FIG. 1, the hard disk drive (hereinafter, referred to as an HDD) 11 includes a flexible printed circuit board assembly (hereinafter, referred to as an FPC assembly) 15, a disk 16, a head 17, and a printed circuit board (hereinafter, referred to as a PCB).

The FPC assembly 15 is attached to a carriage 18 of the head 17, and connects the head 17 and the PCB together, for example. The head 17 is swingable to read and write a record from and to the disk 16. The FPC assembly 15 is bendable along with the swing of the head 17. The carriage 18 is an example of a support member.

Figure 2:
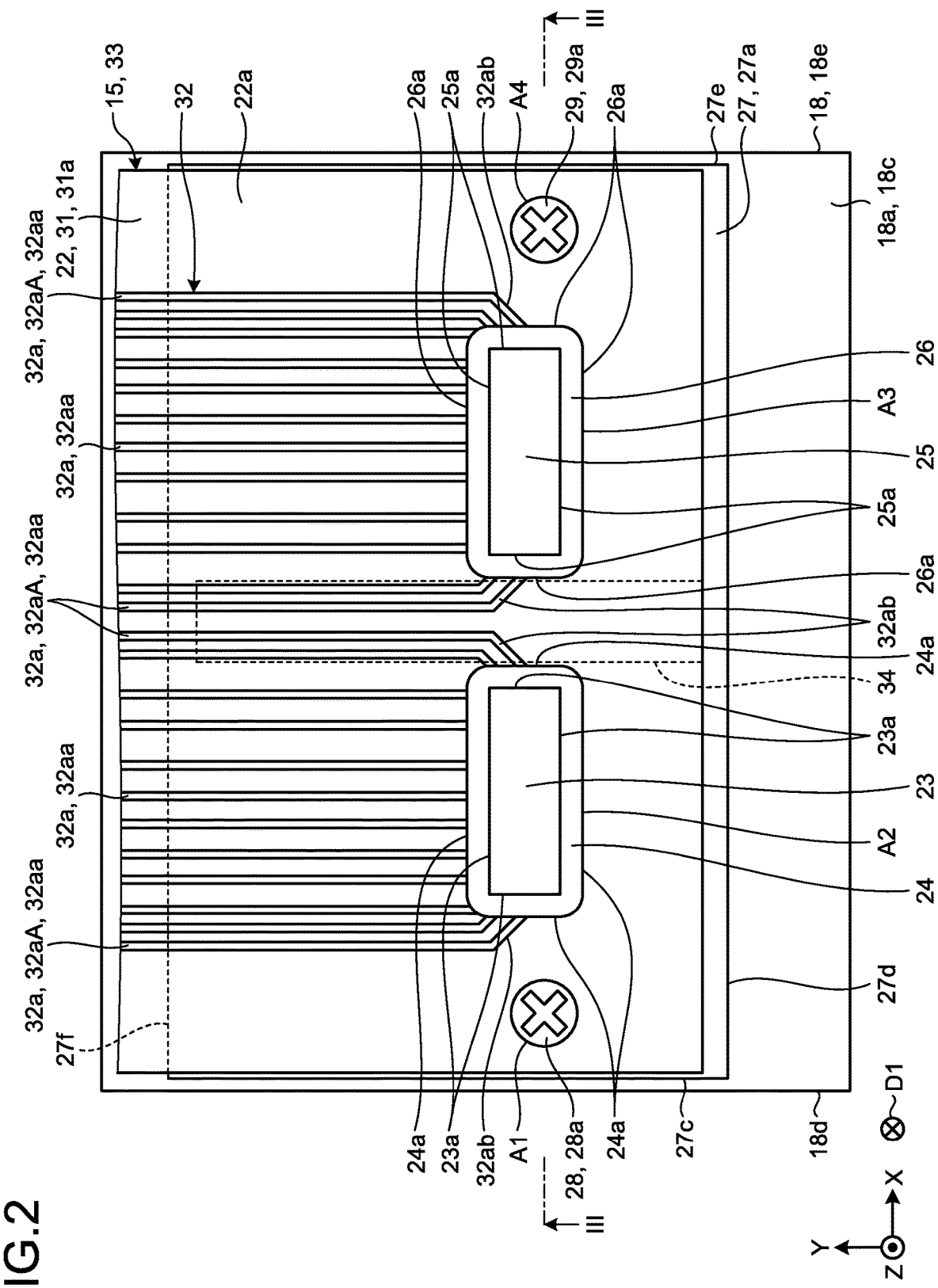
FIG. 2 is an exemplary and schematic plan view of a part of an FPC assembly and a carriage of the first embodiment.
Figure 3:
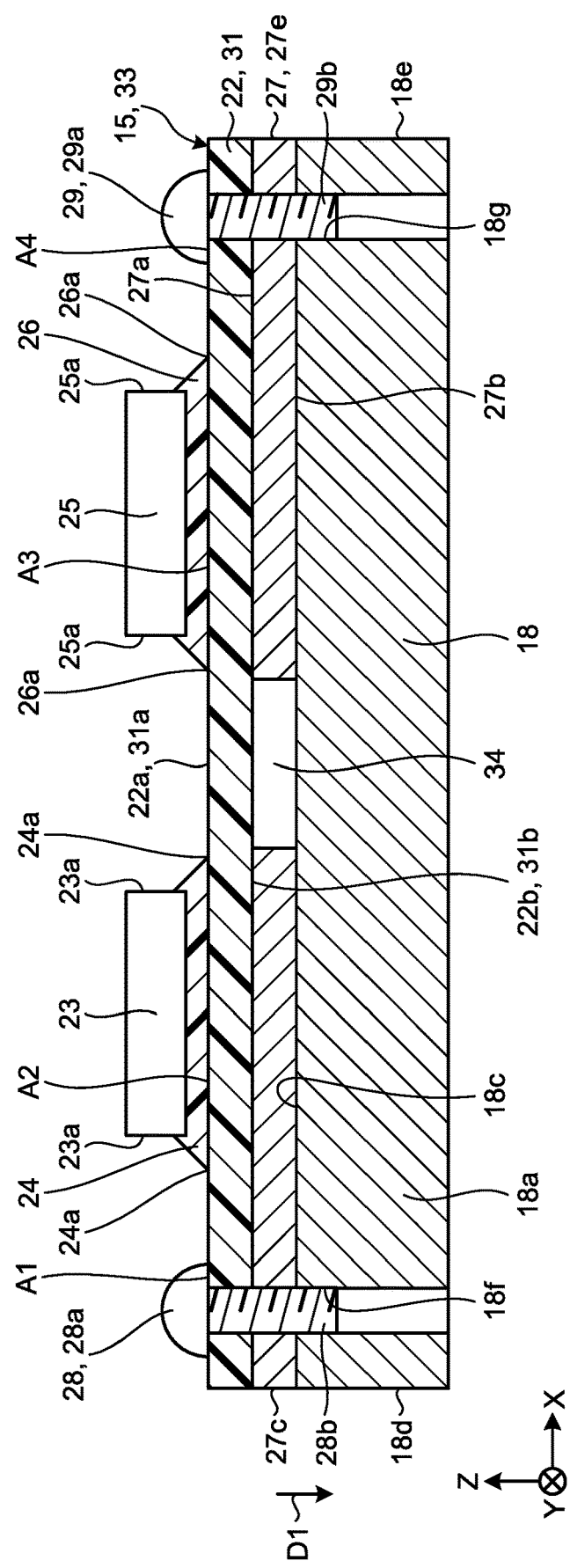
FIG. 3 is a sectional view along III-III of FIG. 2.
Figure 4:
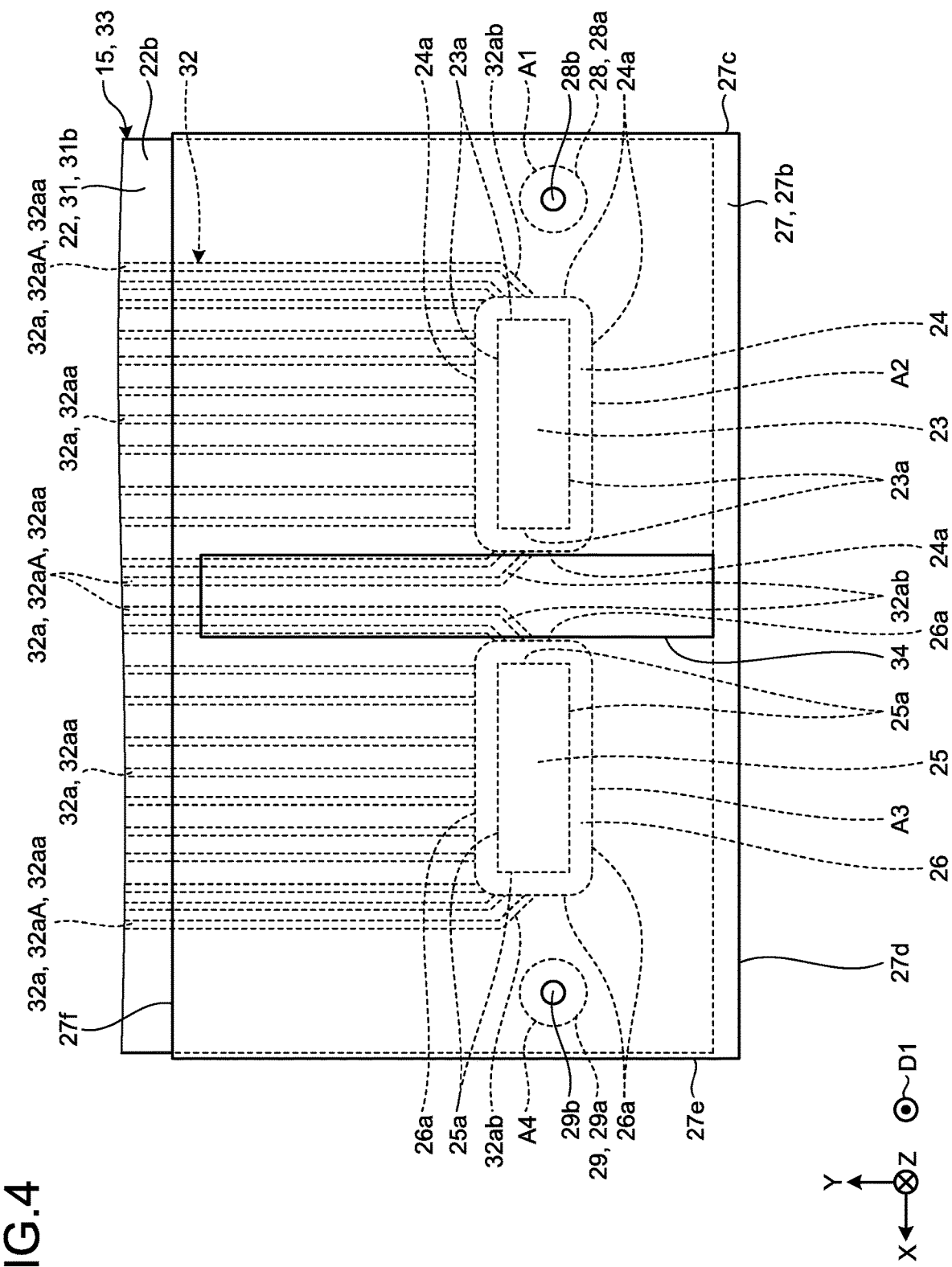
FIG. 4 is a bottom view of a part of the FPC assembly of the first embodiment.

FIG. 2 is an exemplary and schematic plan view of a part of the FPC assembly 15 and the carriage 18 of the first embodiment. FIG. 3 is a sectional view along III-III of FIG. 2. FIG. 4 is a bottom view of a part of the FPC assembly 15 of the first embodiment. FIGS. 2 to 4, illustrate a part of the FPC assembly 15 attached to the carriage 18, for example.

As illustrated in the drawings, herein, an X direction, a Y direction, and a Z direction are defined. The X direction, the Y direction, and the Z direction are orthogonal to one another. The X direction is along the width of the FPC assembly 15. The Y direction is along the length of the FPC assembly 15. The Z direction is along the thickness of the FPC assembly 15.

As illustrated in FIGS. 2 to 4, the FPC assembly 15 includes a flexible printed-wiring board (hereinafter, referred to as an FPC) 22, a first IC 23, a first underfill 24, a second IC 25, a second underfill 26, and a plate 27. The first IC 23 and the second IC 25 are an example of electronic component.

The FPC 22 is a substrate having flexibility. The FPC 22 includes a first surface 22a and a second surface 22b. The second surface 22b is opposite to the first surface 22a. The first surface 22a and the second surface 22b are substantially flat and bend as the FPC 22 bends. The first surface 22a is an example of a first face, and the second surface 22b is an example of a second face.

The FPC 22 further includes a base material 31 and a conductive layer 32. FIG. 3 omits showing the conductive layer 32.

The base material 31 is, for example, formed of a material having insulating properties such as polyester or polyimide, and is a flexible film-like member. The base material 31 includes a first face 31a, and a second face 31b opposite to the first face 31a. The first face 31a forms the first surface 22a of the FPC 22. The second face 31b forms the second surface 22b of the FPC 22.

The conductive layer 32 is formed of a conductor such as copper, and is disposed on the first face 31a of the base material 31. The conductive layer 32 includes a plurality of wires 32a. The wires 32a can also be referred to as patterns or signal lines, for example.

The wires 32a form a part of a circuit on the FPC 22. The wires 32a extend along the first face 31a, that is, the first surface 22a. Each of the wires 32a includes, for example, an extension 32aa extending in the Y direction. Wires 32aA as a part of the wires 32a each include an extension 32ab in addition to the extension 32aa. The extension 32ab is inclined with respect to the X direction and the Y direction. That is, the extension 32ab is inclined with respect to the extension 32aa. The wires 32a may include an extension extending in a different direction. A pad (not illustrated) is disposed on an end of the wires 32a. The pad can also be referred to as a land, an electrode, or a connection, for example. The FPC 22 may be provided with an insulating cover layer that covers the conductive layer 32. The cover layer, when provided, forms the first surface 22a of the FPC 22. Alternatively, the first surface 22a of the FPC 22 may be formed of another member.

The first IC 23 and the second IC 25 are, for example, semiconductor packages including an amplifying circuit (amplifier). The first IC 23 and the second IC 25 are not limited thereto, and may be other components.

The first IC 23 and the second IC 25 both include a plurality of terminals. The terminals are electrically connected to the pad at the end of the wires 32a by, for example, soldering. That is, the first IC 23 and the second IC 25 are electrically connected to the wires 32a. Thus, the first IC 23 and the second IC 25 are mounted on the first surface 22a of the FPC 22.

The first IC 23 and the second IC 25 have a substantially rectangular parallelepiped shape, and include four edges 23a and 25a, respectively. As illustrated in FIG. 2, the edges 23a and 25a face in the X direction, the opposite X direction, the Y direction, and the opposite Y direction, respectively. The shape and the directions of the first IC 23 and the second IC 25 are not limited thereto.

The first IC 23 is spaced apart from the second IC 25 in the opposite direction of the X direction. One of the edges 23a of the first IC 23 faces one of the edges 25a of the second IC 25. The arrangement of the first IC 23 and the second IC 25 is not limited thereto.

As illustrated in FIGS. 2 to 4, the first underfill 24 is, for example, formed of a synthetic resin and attached to the first IC 23 and the first surface 22a of the FPC 22. In other words, the first underfill 24 partially covers the first IC 23 and the FPC 22. Thereby, the first underfill 24 retains the first IC 23 in the FPC 22.

As illustrated in FIG. 3, the first underfill 24 lies between the first IC 23 and the FPC 22, and is attached to the edge 23a of the first IC 23, forming a fillet. As illustrated in FIG. 2, the first underfill 24 surrounds the first IC 23 when the first surface 22a is viewed from the Z direction orthogonal to the first surface 22a of the FPC 22.

As illustrated in FIGS. 2 to 4, the second underfill 26 is, for example, formed of a synthetic resin and is attached to the second IC 25 and the first surface 22a of the FPC 22. In other words, the second underfill 26 partially covers the second IC 25 and the FPC 22. Thereby, the second underfill 26 retains the second IC 25 in the FPC 22.

As illustrated in FIG. 3, the second underfill 26 lies between the second IC 25 and the FPC 22, and is attached to the edge 25a of the second IC 25, forming a fillet. As illustrated in FIG. 2, the second underfill 26 surrounds the second IC 25 when the first surface 22a is viewed from the Z direction orthogonal to the first surface 22a of the FPC 22.

The first underfill 24 and the second underfill 26 include edges 24a and 26a respectively. As illustrated in FIG. 2, the edges 24a and 26a are the ends of the first underfill 24 and the second underfill 26 when the first surface 22a is viewed from the Z direction orthogonal to the first surface 22a. In other words, the edges 24a and 26a are a boundary between the first underfill 24 and the second underfill 26 and an exposed part of the first surface 22a of the FPC 22. The edges 24a of the first underfill 24 are separated from the edges 26a of the second underfill 26.

As illustrated in FIG. 3, the plate 27 is fixed onto the second surface 22b of the FPC 22. Thereby, the plate 27 covers the second surface 22b. The plate 27 is, for example, formed of an aluminum alloy. Thus, the plate 27 has higher rigidity and thermal conductivity than those of the FPC 22. The plate 27 works to improve the rigidity and dissipate heat of the FPC assembly 15, for example. Further, the plate 27 has a higher thermal expansion rate than that of the FPC 22. The plate 27 is not limited thereto, and may be formed of another material such as a synthetic resin, for example.

The plate 27 includes a first face 27a and a second face 27b. The first face 27a is fixed onto the second surface 22b of the FPC 22 by adhesion. The opposing parts of the first face 27a and the second surface 22b are approximately entirely fixed to each other. The second face 27b is opposite the first face 27a and overlaid on the carriage 18. When the plate 27 is viewed from a direction D1 orthogonal to the first surface 22a, as illustrated in FIG. 4, the plate 27 has a quadrangular shape. The orthogonal direction D1 is the opposite direction of the Z direction. The plate 27 has four edges 27c to 27f. The edge 27c and the edge 27e extend in the Y direction, and are spaced apart from each other in the X direction. The edge 27e is located in the X direction of the edge 27c. The edge 27d and the edge 27f extend in the X direction, and are spaced apart from each other in the Y direction. The edge 27f is located in the Y direction of the edge 27d. In addition, as illustrated in FIGS. 2 to 4, the plate 27 is provided with an opening 34. The opening 34 is a through hole penetrating through the width of the plate 27. That is, the opening 34 opens to the first face 27a and the second face 27b. The opening 34 is separated from the edges 27c to 27f of the plate 27. The opening 34 can also be referred to as a slit. The shape of the plate 27 is not limited to the above example.

The first IC 23, the second IC 25, the first underfill 24, the second underfill 26 and the plate 27 are laminated in the opposite direction of the Z direction. The Z direction and the opposite Z direction are an example of thickness direction of a flexible printed-wiring board and the plate 27.

The plate 27 and the FPC 22 form an assembly 33. The assembly 33 can also be referred to as a sub-assembly.

As illustrated in FIG. 3, the FPC 22 is joined with the carriage 18 with a first screw 28 and a second screw 29. The FPC 22 is grounded to the carriage 18 through the first screw 28 and the second screw 29.

The first screw 28 and the second screw 29 include heads 28a and 29a and shafts 28b and 29b respectively. The heads 28a and 29a are secured on the FPC 22. The shafts 28b and 29b are fixed to the carriage 18. The heads 28a and 29a lie on the first surface 22a of the FPC 22 in contact with the first surface 22a. The shafts 28b and 29b are connected to the heads 28a and 29a. The shafts 28b and 29b extend from the heads 28a and 29a, and penetrate through the first surface 22a and the second surface 22b. The first screw 28 and the second screw 29 are made from a metal material. The first screw 28 and the second screw 29 are an example of a member and a fastener. The member may be an adhesive.

As illustrated in FIGS. 2 and 3, the first screw 28 is spaced apart from the second screw 29 in the opposite direction of the X direction. The first IC 23 and the second IC 25 are located between the first screw 28 and the second screw 29. Thus, the first IC 23, the second IC 25, the first screw 28, and the second screw 29 are aligned in the X direction. Specifically, the first IC 23 is located between the first screw 28 and the second IC 25. The second IC 25 is located between the second screw 29 and the first IC 23.

The edge 24a of the first underfill 24 is separated from the first screw 28. The edge 26a of the second underfill 26 is separated from the second screw 29.

As illustrated in FIG. 3, the carriage 18 supports the FPC 22 secured on the plate 27 with the first screw 28 and the second screw 29. The carriage 18 includes a wall 18a. The wall 18a includes a base 18c and a pair of lateral faces 18d and 18e. The base 18c extends along an XY-plane. The lateral faces 18d and 18e extend from the X-directional or its opposite edge of the base 18c in the opposite direction of the Z direction. That is, the lateral faces 18d and 18e are spaced apart from each other in the X direction. The wall 18a is provided with female screws 18f and 18g opening to the base 18c. The second face 27b of the plate 27 contacts the base 18c, and the first screw 28 and the second screw 29 are screwed into the female screws 18f and 18g. The carriage 18 is formed of a metal material, for example.

The FPC 22 attached to the carriage 18, as illustrated in FIGS. 3 and 4, includes first regions A1 to A4. The first regions A1 to A4 are set on the first surface 22a of the FPC 22, and are restrained by the first IC 23, the second IC 25, the first screw 28, and the second screw 29, respectively. That is, the first regions A1 to A4 are regions, on the FPC 22, on which the first IC 23 or the second IC 25 is mounted or to which the first screw 28 or the second screw 29 secured on the carriage 18 is fixed.

Specifically, the first region A1 is a region, of the first surface 22a, on which a head 28a of the first screw 28 is placed, and is held between the head 28a and the base 18c of the carriage 18 and restrained by the carriage 18 through the first screw 28. That is, the first region A2 is a region, on the FPC 22, to which the first screw 28 is fixed. In FIGS. 2 to 4, the edge of the first region A1 coincides with the edge of the head 28a. The first region A2 is a region, of the first surface 22a, on which the first IC 23 and the first underfill 24 are laminated, and is restrained by the first IC 23 through the first underfill 24. That is, the first region A2 includes an area contacting with the first underfill 24 on the FPC 22. In FIGS. 2 to 4, the edge of the first region A2 coincides with the edge 24a of the first underfill 24. The first region A3 is a region, of the first surface 22a, on which the second IC 25 and the second underfill 26 are laminated, and is restrained by the second IC 25 through the second underfill 26. That is, the first region A3 includes an area contacting with the second underfill 26 on the FPC 22. In FIGS. 2 to 4, the edge of the first region A3 coincides with the edge 26a of the second underfill 26. The first region A4 is a region, of the first surface 22a, on which the head 29a of the second screw 29 is placed, and is held between the head 29a and the base 18c of the carriage 18 and restrained by the carriage 18 through the second screw 29. That is, the first region A4 is a region, on the FPC 22, to which the second screw 29 is fixed. In FIGS. 2 to 4, the edge of the first region A4 coincides with the edge of the head 29a.

When the plate 27 is viewed from the orthogonal direction D1, as illustrated in FIG. 4, the first regions A1 to A4 are spaced apart from each other in the X direction. That is, when the plate 27 is viewed from the orthogonal direction D1, the first regions A2 and A3 restrained by the first IC 23 and the second IC 25 are located between the two first regions A1 and A4 restrained by the carriage 18 through the first screw 28 and the second screw 29.

As illustrated in FIG. 4, when the plate 27 is viewed from the orthogonal direction D1, the opening 34 is located between the two first regions A2 and A3 on the plate 27, and extends outward from between the two first regions A2 and A3. Specifically, the opening 34 extends in the Y direction and an opposite direction of the Y direction. The plate 27 provided with the opening 34 does not cover at least part of an area between two first regions A2 and A3 of the FPC 22. In addition, the opening 34 is aligned with at least part of each of the extensions 32aa and 32ab of the wires 32aA laid between the two first regions A2 and A3 in the orthogonal direction D1. FIG. 4 shows an example of the opening 34 formed in part of the area between the two first regions A2 and A3 when the plate 27 is viewed from the orthogonal direction D1, but the opening 34 is not limited thereto. When the plate 27 is viewed from the orthogonal direction D1, the opening 34 may be formed in the entire area between the two first regions A2 and A3, or may overlap with either of the two first regions A2 and A3.

The extensions 32ab of part of the wires 32aA connected to the first IC 23 extend from the first region A2 restrained by the first IC 23 toward the first region A3, and the opening 34 is aligned with the extensions 32aa in the orthogonal direction D1. The extensions 32ab of part of the wires 32aA connected to the second IC 25 extend from the first region A3 restrained by the second IC 25 toward the first region A2, and the opening 34 is aligned with the extensions 32aa in the orthogonal direction D1.

The plate 27 is restrained by the first IC 23, the second IC 25, and the carriage 18 through the first regions A1 to A4.

In the HDD 11 configured as above, for example, while the head 17 reads or writes a record from or to the disk 16, heat is generated from the first IC 23 and the second IC 25 and transferred to the plate 27, thermally expanding or thermally deforming the plate 27. In this case, the plate 27 is likely deformed into a convex bend between the first screw 28 and the second screw 29 oppositely to the carriage 18, that is, toward the FPC 22 (the Z direction). Part of the plate 27, which corresponds to the first regions A1 to A4, is restrained by the first IC 23, the second IC 25, and the carriage 18 through the first regions A1 to A4, and is thus restricted from being deformed. For this reason, the parts of the plate 27 corresponding to the first screw 28 and the second screw 29 more largely deform than the part corresponding to each of the first regions A1 to A4. In addition, the thermal expansion rate of the plate 27 is higher than the thermal expansion rate of the FPC 22, and the plate 27 thermally expands more largely than the FPC 22. Because of this, the FPC 22 is deformed integrally with the plate 27 between the first screw 28 and the second screw 29 by a pressing force from the plate 27. This also causes the FPC 22 to deform in the parts among the first regions A1 to A4 more largely than in the first regions A1 to A4. In view of this, in the first embodiment as described above, the plate 27 is provided with the opening 34 between the two first regions A2 and A3, for example, when the plate 27 is viewed from the orthogonal direction D1. This can reduce the thermal deformation of the plate 27 and the deformation of the part of the FPC 22 between the two first regions A2 and A3, reducing stress concentration on the wires 32aA in and around the part concerned.

Figure 5:
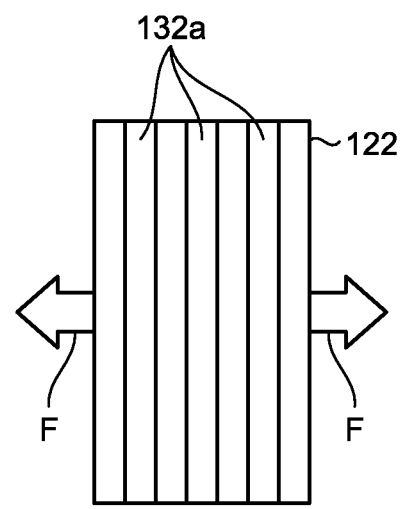
FIG. 5 is an exemplary schematic view of another wiring for illustrating reduction in stress concentration on wiring in the first embodiment.
Figure 6:
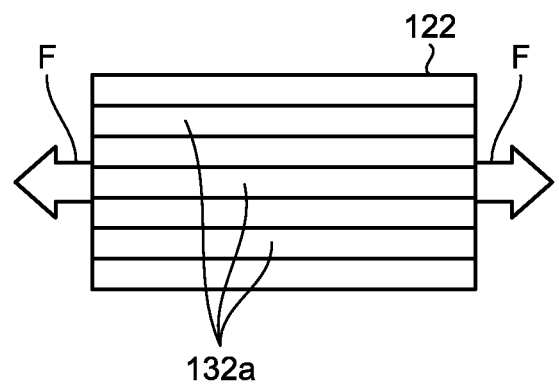
FIG. 6 is an exemplary and schematic view of another wiring for illustrating reduction in stress concentration on the wiring in the first embodiment.

FIGS. 5 and 6 are exemplary and schematic views of wires 132a for illustrating reduction in the stress concentration on the wires 32aA in the first embodiment. FIGS. 5 and 6 illustrate an FPC 122 on which the wires 132a are arranged. Stress concentration more likely occurs on the edge of the wires 132a when a tensile load F acts on the FPC 122 in the extending direction of the wires 132a as illustrated in FIG. 6 than when the tensile load F acts on the FPC 122 orthogonally to the extending direction of the wires 132a as illustrated in FIG. 5. Stress concentration also occurs in the same manner by a compressive load. For this reason, in the first embodiment as illustrated in FIG. 4, the opening 34 is aligned with at least part of the extensions 32ab of the wires 32aA located between the two first regions A2 and A3 in the orthogonal direction D1. This can reduce stress concentration on the extensions 32ab.

As described above, in this embodiment the flexible printed-wiring board (FPC) 22 includes the first regions A1 to A4 restrained by the first IC 23 (electronic component), the second IC 25 (electronic component), and the carriage 18 (support member). When the plate 27 is viewed from the direction D1 orthogonal to the first surface 22a (first face), the opening 34 is located between the two first regions A2 and A3 in the plate 27. This can restrict the plate 27 from thermally deforming, and the part of the FPC 22 between the first regions A2 and A3 from deforming, thereby reducing the stress concentration on the wires 32aA laid in and around the part concerned.

In the first embodiment, when the plate 27 is viewed from the orthogonal direction D1, the opening 34 extends outward from between the two first regions A2 and A3 restrained by the first IC 23 and the second IC 25 respectively. This can reduce local thermal deformation of the plate 27 on the periphery of the opening 34, compared to the opening 34 not extending outward from between the two first regions A2 and A3. Thus, the part of the FPC 22 between the two first regions A2 and A3 is prevented from being deformed, reducing stress concentration on the wires 32a laid on and around the part concerned.

OTHER EMBODIMENTS

Next, second to fifteenth embodiments will be described referring to FIGS. 7 to 21. HDDs of the second to fifteenth embodiments have the same configuration as that of the HDD 11 of the first embodiment. Thus, the second to fifteenth embodiments can attain the same results (effects) based on the same configuration, as with the first embodiment. Hereinafter, differences between the HDDs of the second to fifteenth embodiments and the HDD 11 of the first embodiment will be mainly described.

Second Embodiment

Figure 7:
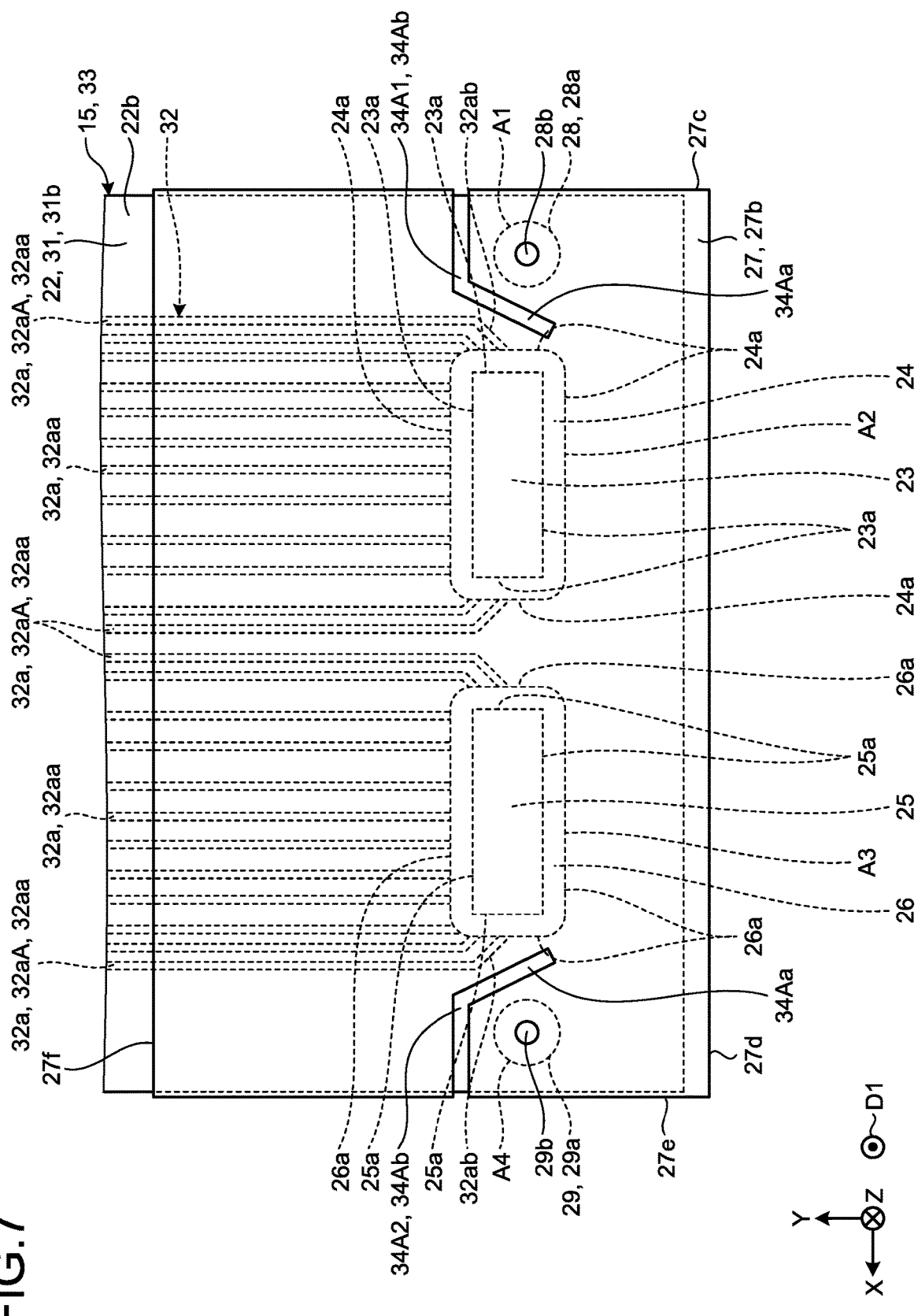
FIG. 7 is a bottom view of a part of an FPC assembly of a second embodiment.

FIG. 7 is a bottom view of a part of a FPC assembly 15 of a second embodiment. As illustrated in FIG. 7, in the second embodiment, the plate 27 is provided with two opening 34A1 and 34A2 instead of the opening 34 of the first embodiment. The openings 34A1 and 34A2 are cutouts.

When the plate 27 is viewed from the orthogonal direction D1, the opening 34A1 is formed around the first region A1, and is partially located between two first regions A1 and A2 in the plate 27. When viewed from the orthogonal direction D1, the opening 34A2 is formed around the first region A4 and partially located between two first regions A3 and A4 in the plate 27.

The openings 34A1 and 34A2 are formed at the edges 27c and 27e of the plate 27, respectively, penetrating through the width of the plate 27. That is, the openings 34A1 and 34A2 open to the first face 27a and the second face 27b. The openings 34A1 and 34A2 include extensions 34Aa and 34Ab respectively.

When the plate 27 is viewed from the orthogonal direction D1, the extension 34Aa of the opening 34A1 is located between the first region A1 and the first region A2, and inclined from the first region A2 to the first region A1, i.e., in the Y direction while extending in the X direction. When the plate 27 is viewed from the orthogonal direction D1, the extension 34Ab of the opening 34A1 is located in the Y direction of the first region A1. The extension 34Ab extends from the Y-directional end of the extension 34Aa oppositely to the X direction, and opens to the edge 27c.

When the plate 27 is viewed from the orthogonal direction D1, the extension 34Aa of the opening 34A2 is located between the first region A3 and the first region A4, and inclined relative to the Y direction from the first region A3 to the first region A4 while extending in the X direction. When the plate 27 is viewed from the orthogonal direction D1, the extension 34Ab of the opening 34A2 is located in the Y direction of the first region A4. The extension 34Ab extends in the X direction from the Y-directional end of the extension 34Aa, and opens to the edge 27e.

As described above, in the second embodiment, the openings 34A1 and 34A2 are formed around the first regions A1 and A4 restrained by the carriage 18 when the plate 27 is viewed from the orthogonal direction D1. According to the second embodiment, thus, the plate 27 and the FPC 22 around the first regions A1 and A4 are restricted from deforming, thereby reducing stress concentration on the wires 32a located between the first regions A1 and A4 and the first regions A2 and A3 and on the periphery thereof.

Third Embodiment

Figure 8:
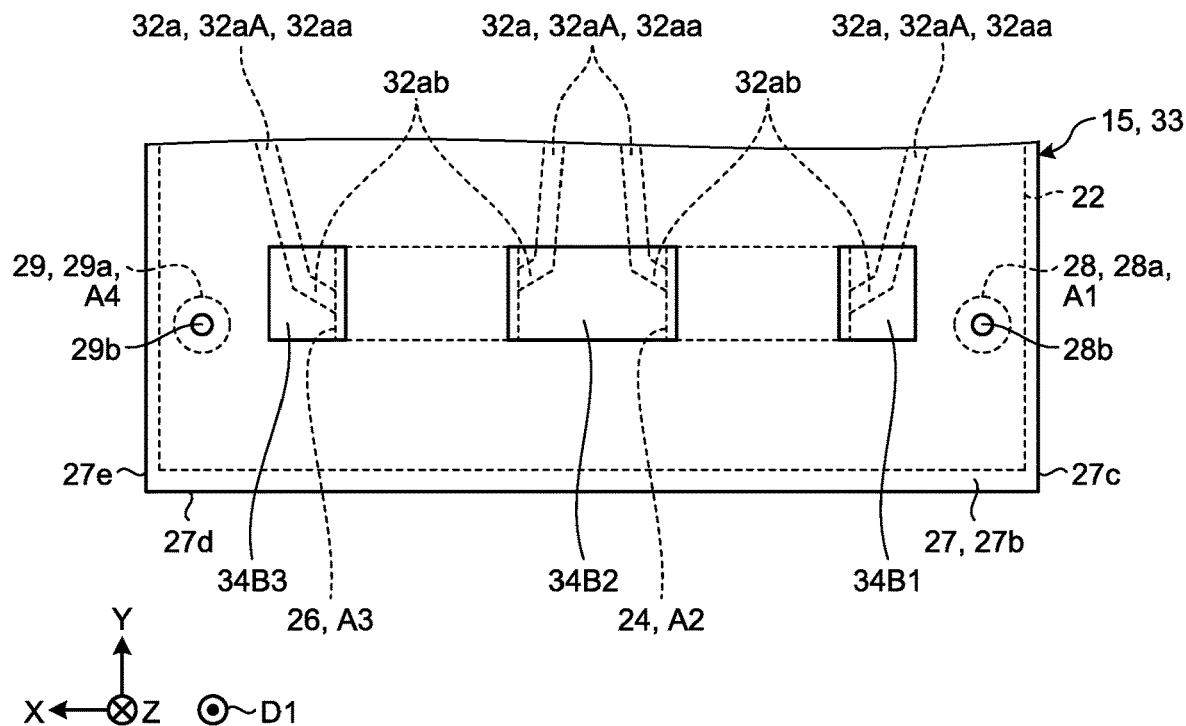
FIG. 8 is a bottom view of a part of an FPC assembly of a third embodiment.

FIG. 8 is a bottom view of a part of a FPC assembly 15 of a third embodiment. In the third embodiment as illustrated in FIG. 8, the plate 27 is provided with three openings 34B1, 34B2, and 34B3 instead of the opening 34 of the first embodiment. The openings 34B1, 34B2, and 34B3 are all through holes.

When the plate 27 is viewed from the orthogonal direction D1, the opening 34B1 is located between the first region A1 and the first region A2 in the plate 27, and is aligned with the extensions 32ab of the wires 32aA between the first region A1 and the first region A2.

When the plate 27 is viewed from the orthogonal direction D1, the opening 34B2 is located between the first region A2 and the first region A3 in the plate 27, and is aligned with the extensions 32ab of the wires 32aA between the first region A2 and the first region A3.

When the plate 27 is viewed from the orthogonal direction D1, the opening 34B3 is located between the first region A3 and the first region A4 in the plate 27, and is aligned with the extensions 32ab of the wires 32aA between the first region A3 and the first region A4.

Each of the extensions 32ab is an example of extension from each of the first regions A1 to A4 to a different one of the first regions A1 to A4.

As described above, in the third embodiment, when the plate 27 is viewed from the orthogonal direction D1, the openings 34B1, 34B2, and 34B3 are located in the areas between the adjacent ones of the first regions A1 to A4 in the X direction, respectively. According to the third embodiment, the plate 27 and the FPC 22 are restricted from deforming in the area between and on the periphery of the first regions A1 and A4, thereby reducing stress concentration on the wires 32a laid between the first regions A1 and A4 and on the periphery thereof.

Fourth Embodiment

Figure 9:
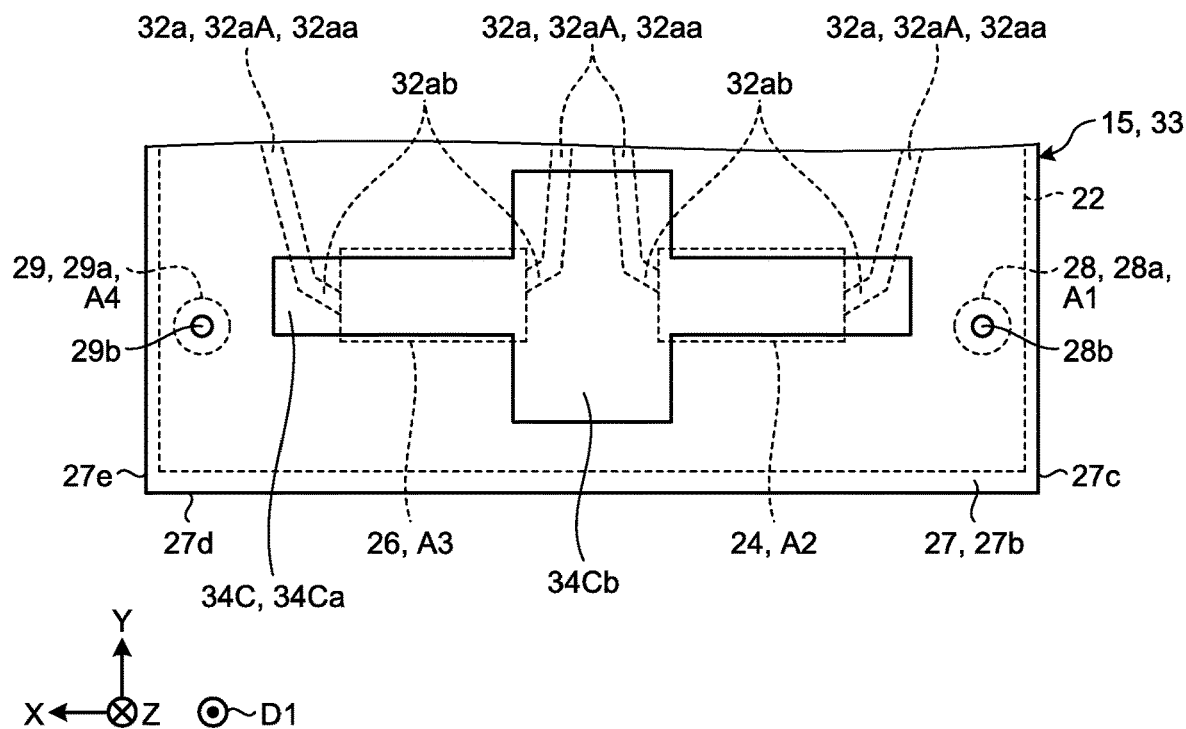
FIG. 9 is a bottom view of a part of an FPC assembly of a fourth embodiment.

FIG. 9 is a bottom view of a part of a FPC assembly 15 of a fourth embodiment. As illustrated in FIG. 9, in the fourth embodiment, the plate 27 is provided with an opening 34C instead of the opening 34 of the first embodiment.

The opening 34C is a through hole. The opening 34C includes a first part 34Ca and a second part 34Cb.

When the plate 27 is viewed from the orthogonal direction D1, the first part 34Ca extends across two of the first regions A1 to A4. That is, the first part 34Ca extends in the X direction. The second part 34Cb extends between the two first regions A2 and A3 in the plate 27, and extends outward from between two first regions A2 and A3. Specifically, the second part 34Cb extends in the Y direction. The first part 34Ca and the second part 34Cb intersect with each other.

As configured above, the plate 27 and the FPC 22 are restricted from deforming in the area between the first region A1 and the first region A4, or on the periphery of the first regions A1 and A4, reducing stress concentration on the wires 32a in the area between or on the periphery of the first region A1 and the first region A4.

Fifth Embodiment

Figure 10:
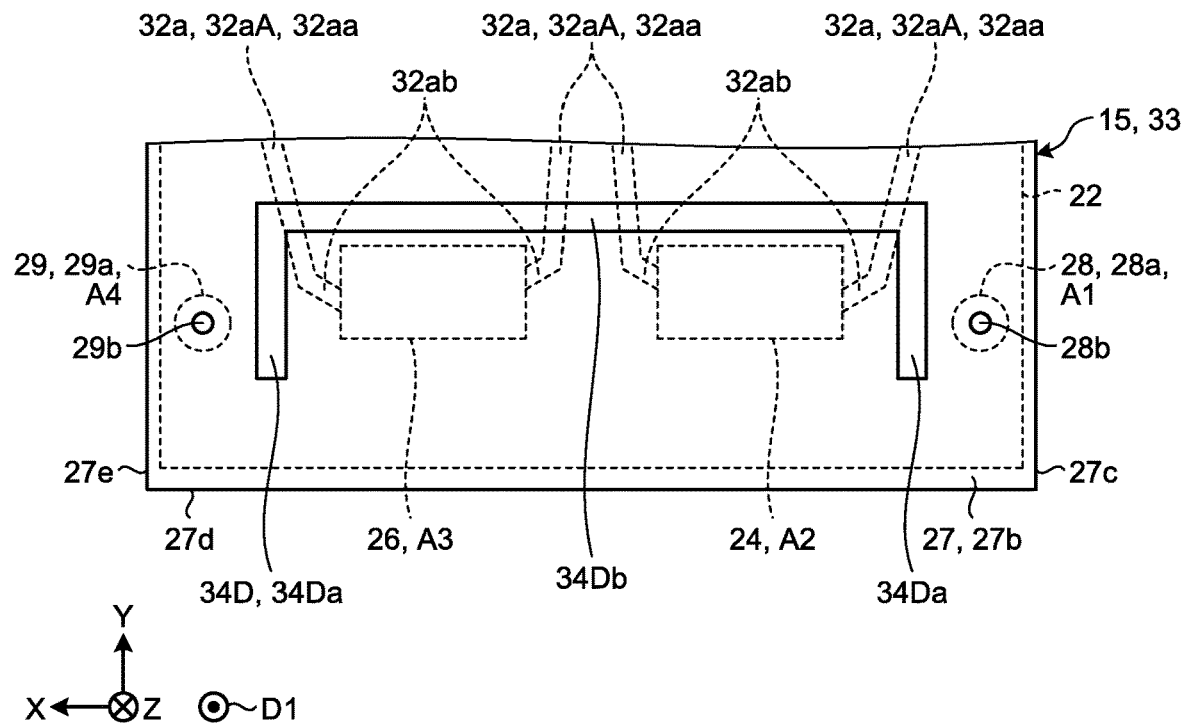
FIG. 10 is a bottom view of a part of an FPC assembly of a fifth embodiment.

FIG. 10 is a bottom view of a part of a FPC assembly 15 of a fifth embodiment. As illustrated in FIG. 10, in the fifth embodiment, the plate 27 is provided with an opening 34D instead of the opening 34 of the first embodiment.

The opening 34D is a through hole. The opening 34D includes a plurality of first parts 34Da and a second part 34Db connecting the first parts 34Da.

When the plate 27 is viewed from the orthogonal direction D1, the first parts 34Da are located between two of the first regions A1 to A4, and the first parts 34Da extend in at least one of the first regions A1 to A4. Specifically, when the plate 27 is viewed from the orthogonal direction D1, one of the first parts 34Da is located between the first region A1 and the first region A2, and the other first part 34Da is located between the first region A3 and the first region A4. The second part 34Db connects the ends of the first parts 34Da in the Y direction.

As configured above, the plate 27 and the FPC 22 are restricted from deforming between the first region A1 and the first region A4 or on the periphery thereof, reducing stress concentration on the wires 32a laid between the first region A1 and the first region A4 or on the periphery thereof.

Sixth Embodiment

Figure 11:
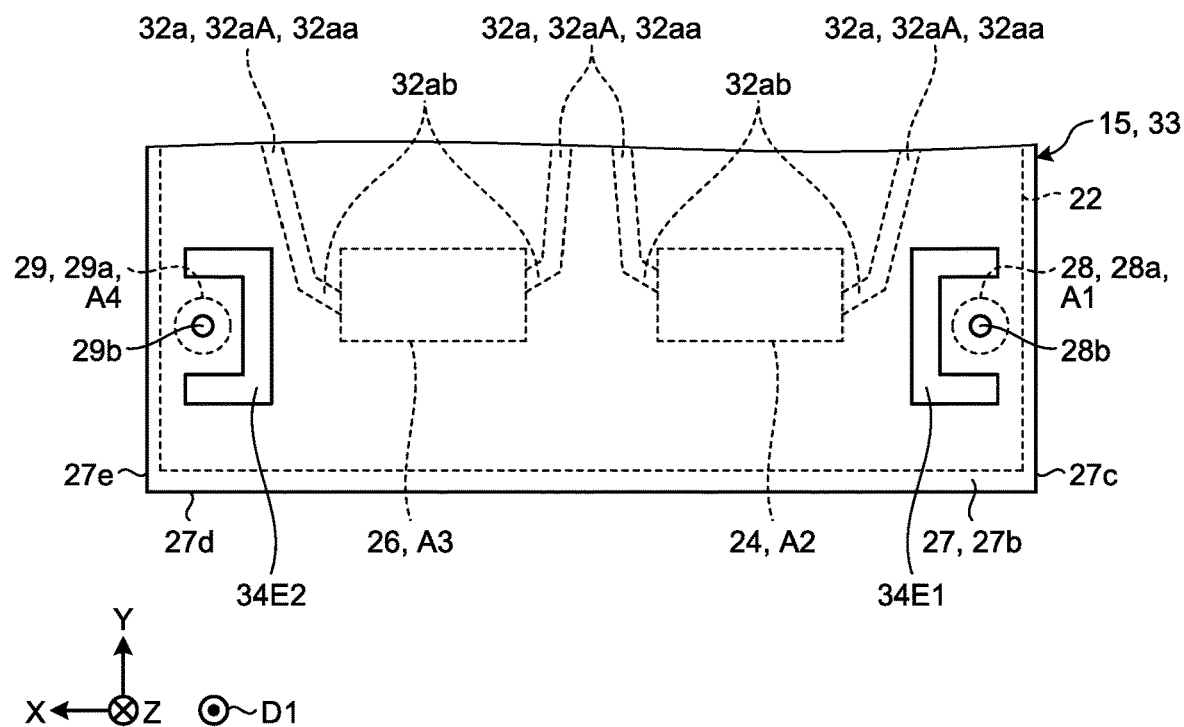
FIG. 11 is a bottom view of a part of an FPC assembly of a sixth embodiment.

FIG. 11 is a bottom view of a part of a FPC assembly 15 of a sixth embodiment. As illustrated in FIG. 11, in the sixth embodiment, the plate 27 is provided with two openings 34E1 and 34E2 instead of the opening 34 of the first embodiment. The openings 34E1 and 34E2 are through holes.

When the plate 27 is viewed from the orthogonal direction D1, the opening 34E1 is formed around the first region A1 and partially extends between the two first regions A1 and A2 in the plate 27. In addition, when the plate 27 is viewed from the orthogonal direction D1, the opening 34E1 has substantially a U-shape opening in the opposite direction of the X direction.

When the plate 27 is viewed from the orthogonal direction D1, the opening 34E2 is formed around the first region A4 and partially extends between the two first regions A3 and A4 in the plate 27. In addition, when the plate 27 is viewed from the orthogonal direction D1, the opening 34E2 has approximately a U-shape opening in the X direction.

As described above, in this embodiment, when the plate 27 is viewed from the orthogonal direction D1, the openings 34E1 and 34E2 are formed around the first regions A1 and A4 restrained by the carriage 18, respectively. According to this embodiment, thus, the plate 27 and the FPC 22 are restricted from deforming on the periphery of the first regions A1 and A4, reducing the stress concentration on the wires 32a laid in the areas between the first regions A1 and A4 and the first regions A2 and A3.

Seventh Embodiment

Figure 12:
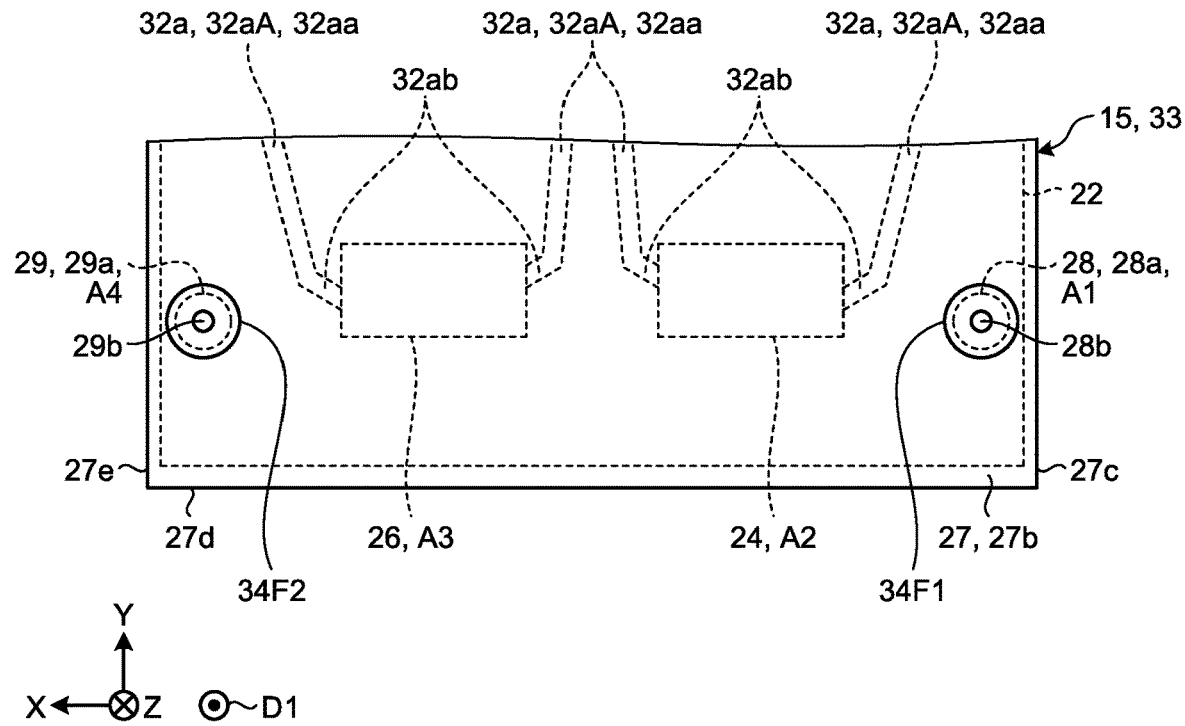
FIG. 12 is a bottom view of a part of an FPC assembly of a seventh embodiment.

FIG. 12 is a bottom view of a part of a FPC assembly 15 of a seventh embodiment. As illustrated in FIG. 12, in the seventh embodiment, the plate 27 is provided with two openings 34F1 and 34F2 instead of the opening 34 of the first embodiment. The openings 34F1 and 34F2 are through holes.

When the plate 27 is viewed from the orthogonal direction D1, the head 28a of the first screw 28 is contained in the opening 34F1, and a part of the opening 34F1 is located between the first region A1 and the first region A2.

When the plate 27 is viewed from the orthogonal direction D1, the head 29a of the second screw 29 is contained in the opening 34F2, and a part of the opening 34F2 is located between the first region A3 and the first region A4.

As configured above, the plate 27 and the FPC 22 are restricted from deforming between the first regions A1 and A3 and the first regions A2 and A4 or on the periphery thereof, reducing stress concentration on the wires 32a laid in the areas between the first regions A1 and A4 and between the first regions A2 and A3.

Eighth Embodiment

Figure 13:
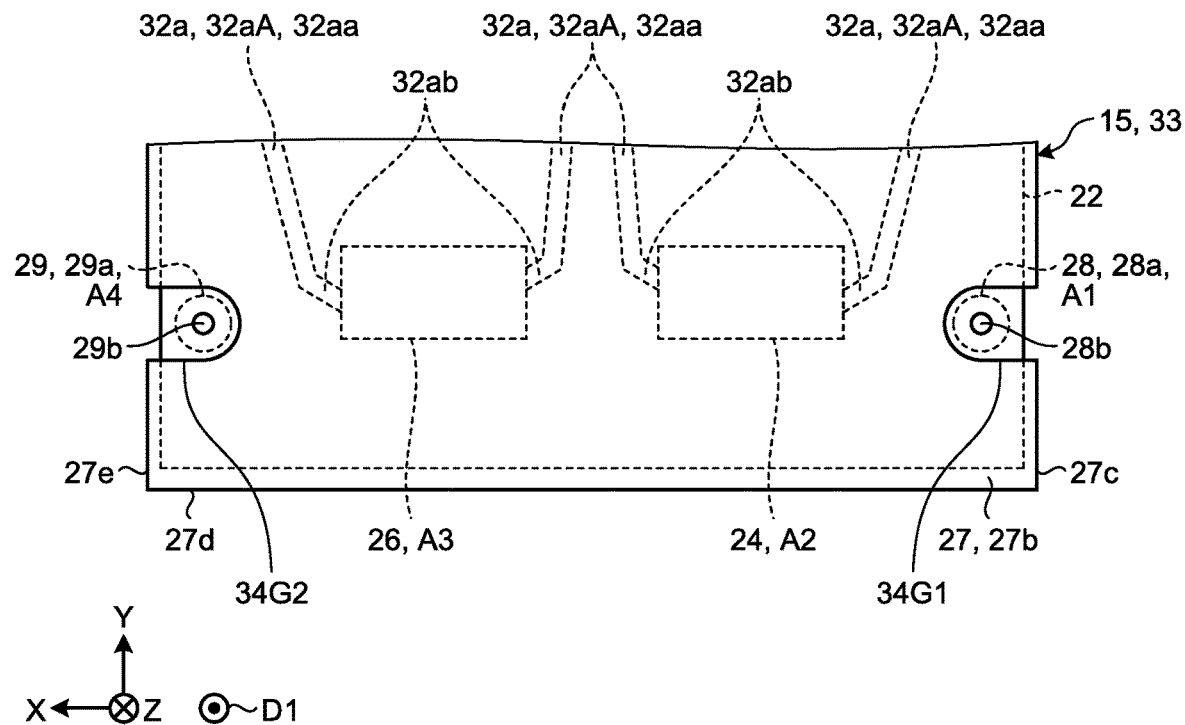
FIG. 13 is a bottom view of a part of an FPC assembly of an eighth embodiment.

FIG. 13 is a bottom view of a part of a FPC assembly 15 of an eighth embodiment. As illustrated in FIG. 13, in the eighth embodiment, the plate 27 is provided with two openings 34G1 and 34G2 instead of the opening 34 of the first embodiment. The openings 34G1 and 34G2 are cutouts from the edges 27c and 27e.

When the plate 27 is viewed from the orthogonal direction D1, the head 28a of the first screw 28 is contained in the opening 34G1, and a part of the opening 34G1 is located between the first region A1 and the first region A2. The opening 34G1 opens in the opposite direction of the X direction.

When the plate 27 is viewed from the orthogonal direction D1, the head 29a of the second screw 29 is contained in the opening 34G2, and a part of the opening 34G2 is located between the first region A3 and the first region A4. The opening 34G2 opens in the X direction.

As configured above, the plate 27 is not held between the first screw 28 and the second screw 29, and the carriage 18, that is, is not fixed to the carriage 18 with the first screw 28 and the second screw 29. Only the FPC 22 is fixed to the carriage 18 with the first screw 28 and the second screw 29. According to such a configuration, the plate 27 and the FPC 22 are restricted from deforming in the areas between the first regions A1 and A3 and the first regions A2 and A4 or on the periphery thereof, reducing stress concentration on the wires 32a laid between the first regions A1 and A4 and the first regions A2 and A3.

Ninth Embodiment

Figure 14:
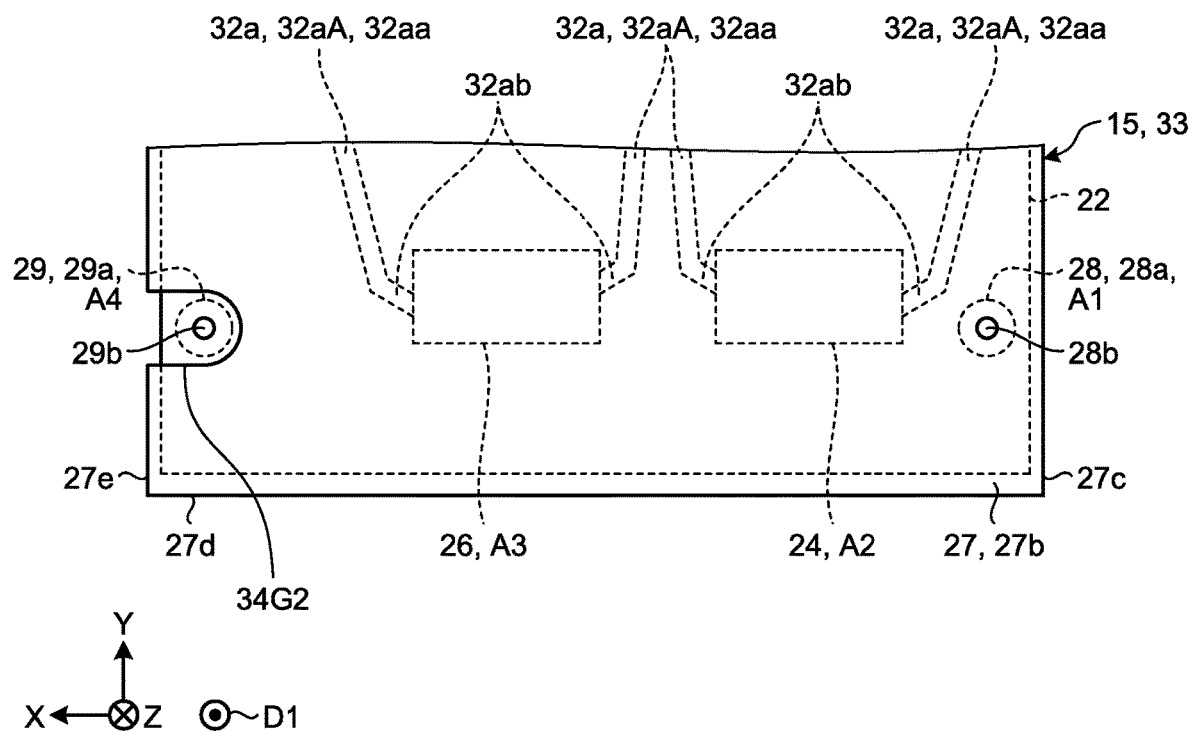
FIG. 14 is a bottom view of a part of an FPC assembly of a ninth embodiment.

FIG. 14 is a bottom view of a part of a FPC assembly 15 of a ninth embodiment. As illustrated in FIG. 14, in the ninth embodiment, the plate 27 is provided with an opening 34G2 instead of the opening 34 of the first embodiment. The shape and arrangement of the opening 34G2 are similar to those in the eighth embodiment.

In this embodiment, in the area between the first screw 28 and the second screw 29, the first IC 23, the first underfill 24, the second IC 25, the second underfill 26, the wires 32a, and the first regions A2 and A3 are placed closer to the first screw 28. That is, the first IC 23, the first underfill 24, the second IC 25, the second underfill 26, the wires 32a, and the first regions A2 and A3 are placed closer to one of the first region A1 and the first region A4, specifically, the first region A1, in the area between the first region A1 and the first region A4. In other words, a pair or set of the first regions A2 and A3 is closer to one of the first region A1 and the first region A4, specifically, the first region A1 in the area between the first region A1 and the first region A4. The distance between the first regions A3 and A4 is longer than the distances between the first regions A1 and A2 and between the first regions A2 and A3.

As configured above, the distance between the first regions A3 and A4 is longer than the distances between the first regions A1 and A2 and between the first regions A2 and A3, and the plate 27 is not held between the second screw 29 and the carriage 18. Thus, of the part of the plate 27 corresponding to the area-between the first regions A1 and A4, the part between the first regions A3 and A4 is more likely to deform than the part between the first regions A1 and A3, that is, the part between the first regions A1 and A3 is less likely to deform than the part between the first regions A3 and A4. In addition, of the part of the plate 27 corresponding to the area between the first regions A3 and A4, the vicinity of the first region A4 is more likely to deform than the vicinity of the first region A3. Thus, in this embodiment, of the part of the plate 27 corresponding to the area between the first regions A1 and A4, the vicinity of the first region A4 is made more easily deformable than the area between the first regions A1 and A3 and in the vicinity of the first region A3, and the wires 32a are arranged closer to the first region A1. This can restrict the plate 27 and the FPC 22 from deforming between the first regions A1 and A3 and in the vicinity of the first region A3, reducing stress concentration on the wires 32a located between the first regions A1 and A3 and in the vicinity of the first region A3.

Tenth Embodiment

Figure 15:
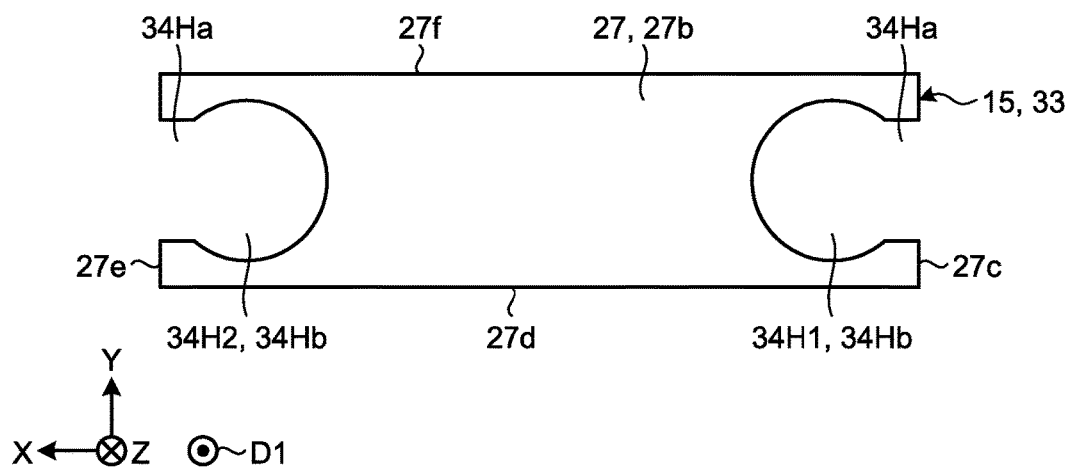
FIG. 15 is a bottom view of a part of an FPC assembly of a tenth embodiment.

FIG. 15 is a bottom view of a part of a FPC assembly 15 of a tenth embodiment. As illustrated in FIG. 15, in the tenth embodiment, the plate 27 is provided with two openings 34H1 and 34H2 instead of the opening 34 of the first embodiment.

The openings 34H1 and 34H2 are cutouts disposed similarly to the openings 34G1 and 34G2 of the ninth embodiment. However, the shape of the openings 34H1 and 34H2 is different from that of the openings 34G1 and 34G2 of the ninth embodiment. The openings 34H1 and 34H2 each include a first part 34Ha and a second part 34Hb. The first parts 34Ha of the openings 34H1 and 34H2 extend in the X direction or the opposite direction of the X direction from the edges 27c and 27e respectively, and have a constant width in the Y direction. The second parts 34Hb are connected to the ends of the first parts 34Ha in the X direction or in the opposite direction of the X direction. When the plate 27 is viewed from the orthogonal direction D1, the edges of the second parts 34Hb facing the plate 27 have a C-shape opening to the first parts 34Ha. The maximum width of the second parts 34Hb is wider than the width of the first parts 34Ha in the Y direction.

Eleventh Embodiment

Figure 16:
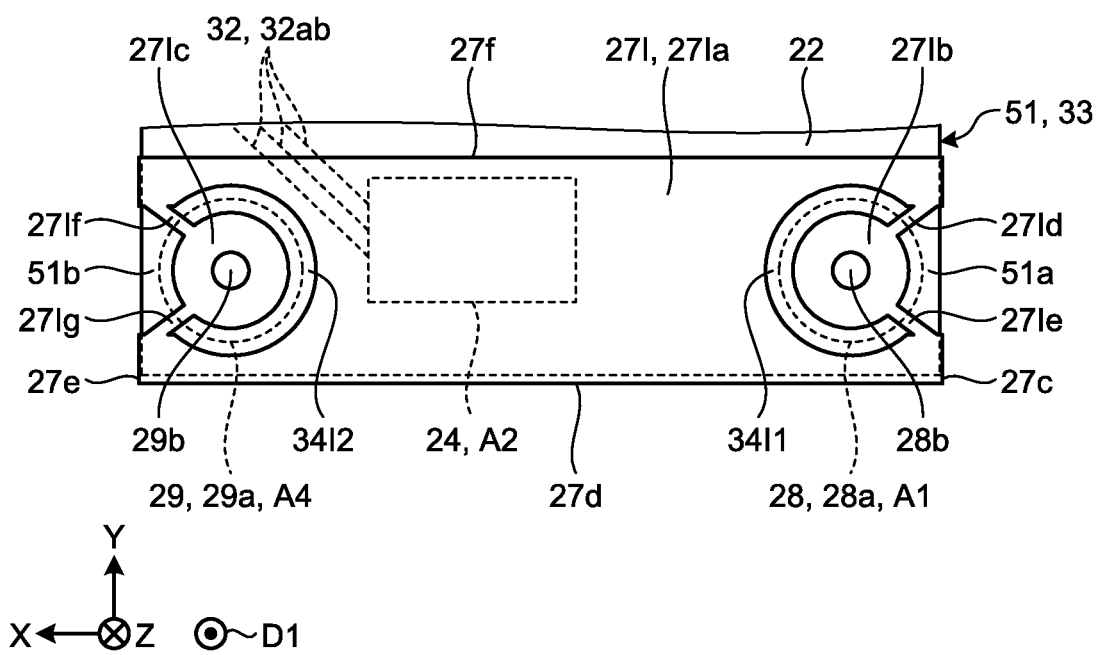
FIG. 16 is a bottom view of a part of an FPC assembly of an eleventh embodiment.

FIG. 16 is a bottom view of a part of a FPC assembly 15 of an eleventh embodiment. As illustrated in FIG. 16, in the eleventh embodiment the FPC assembly 15 includes a plate 27I and two openings 34I1 and 34I2 instead of the plate 27 and the opening 34 of the first embodiment. FIG. 16 shows an example of the FPC assembly 15 excluding the second IC 25, the second underfill 26, and the first region A3 but it may include such elements.

The plate 27I includes a first reinforcement 27Ia, two second reinforcements 27Ib and 27Ic, and four connections 27Id to 27Ig. The first reinforcement 27Ia is placed on the first region A2 restrained by the first IC 23.

The second reinforcements 27Ib and 27Ic have a ring shape surrounding the shafts 28b and 29b. The second reinforcements 27Ib and 27Ic are held between the heads 28a and 29a and the base 18c of the carriage 18 while surrounding the shafts 28b and 29b.

The connections 27Id and 27Ie partially connect between the first reinforcement 27Ia and the second reinforcement 27Ib. The connections 27Id and 27Ie extend in the opposite direction of the X direction from a part of the second reinforcement 27Ib opposite to the X direction, while separating away from each other.

The connections 27If and 27Ig partially connect between the first reinforcement 27Ia and the second reinforcement 27Ic. The connections 27If and 27Ig extend in the X direction from a part of the second reinforcement 27Ic, while separating away from each other. The connections 27If are approximately in parallel to the extension 32ab of the wires 32a. FIG. 16 depicts each of the wires 32a by a broken line.

The openings 34I1 and 34I2 are through holes. The openings 34I1 and 34I2 are formed between the first reinforcement 27Ia and the second reinforcements 27Ib and 27Ic. When the plate 27I is viewed from the orthogonal direction D1, the openings 34I1 and 34I2 have approximately a C-shape. When the plate 27I is viewed from the orthogonal direction D1, the opening 34I1 is located between the first region A1 and the first region A2, and the opening 34I2 is located between the first region A2 and the first region A4.

The plate 27I is further provided with openings 51a and 51b. The openings 51a and 51b are cutouts from the edges 27c and 27e. The openings 51a and 51b penetrate through the width of the plate 27I. The opening 51a faces the connections 27Id and 27Ie and the second reinforcement 27Ib. The opening 51b faces the connections 27If and 27Ig and the second reinforcement 27Ic.

As configured above, the connections 27Id and 27Ie are located between the edges of the openings 34I1 and 51a, and the connections 27If and 27Ig are located between the edges of the opening 34I2 and 51b. The connections 27Id to 27Ig can also be referred to as bridges.

As described above, in this embodiment, the FPC 22 is joined with the carriage 18 with the first screw 28 and the second screw 29 (fastener) including the heads 28a and 29a placed on the first surface 22a (first face), and the shafts 28b and 29b connected to the heads 28a and 29a and penetrating through the first surface 22a and the second surface 22b. In addition, the first regions A1 and A4 restrained by the carriage 18 are held between the heads 28a and 29a and the carriage 18. The plate 27I includes the first reinforcement 27Ia placed on the first region A2 restrained by the first IC 23, the second reinforcements 27Ib and 27Ic held between the heads 28a and 29a and the carriage 18 while surrounding the shafts 28b and 29b, and the connections 27Id to 27Ig partially connecting between the first reinforcement 27Ia and the second reinforcements 27Ib and 27Ic. The plate 27I is also provided with the openings 34I1 and 34I2 extending between the first reinforcement 27Ia and the second reinforcements 27Ib and 27Ic. By such a configuration, the plate 27 and the FPC 22 are restricted from deforming in the areas between the first regions A1 and A4, and the first region A2 or on the periphery thereof, reducing stress concentration on the wires 32a laid between the first regions A1 and A4, and the first region A2.

In this embodiment, when the plate 27I is viewed from the orthogonal direction D1, the opening 34I2 is provided between the connections 27If and 27Ig, and the wires 32a. If thermal deformation of the connections 27If and 27Ig causes the FPC 22 placed on the connections 27If and 27Ig to locally deform, thus, the wires 32a laid on the FPC 22 can be restricted from deforming, reducing stress concentration on the wires 32a.

The shape or the number of connections partially connecting between the first reinforcement 27Ia and the second reinforcements 27Ib and 27Ic are not limited to the above examples. For example, one or three or more connections may be provided for each of the first reinforcement 27Ia and the second reinforcements 27Ib and 27Ic. The connections may be located between the edges of one opening or between the opening and the edges 27c to 27f.

Twelfth Embodiment

Figure 17:
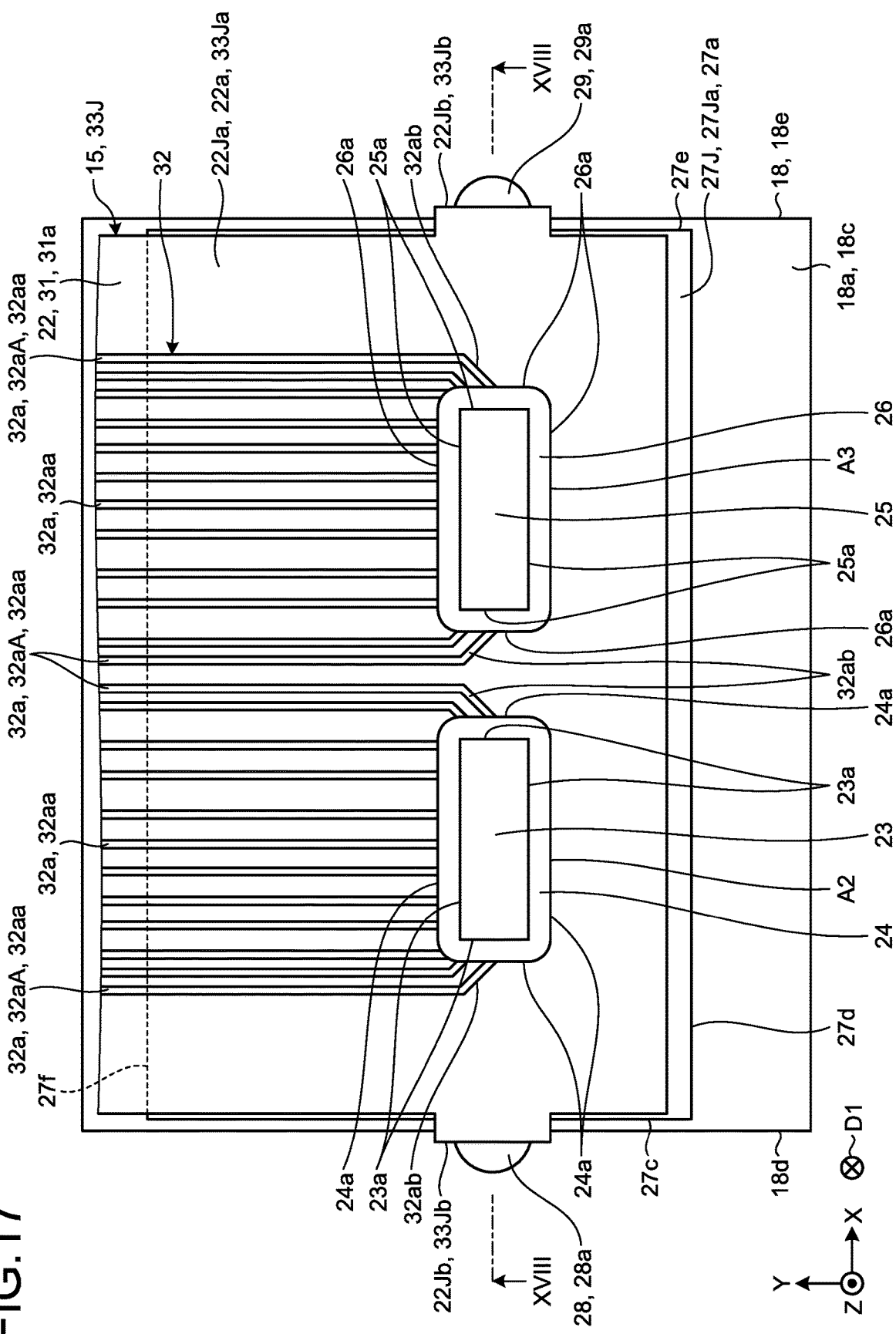
FIG. 17 is an exemplary and schematic plan view of a part of an FPC assembly and a carriage of a twelfth embodiment.
Figure 18:
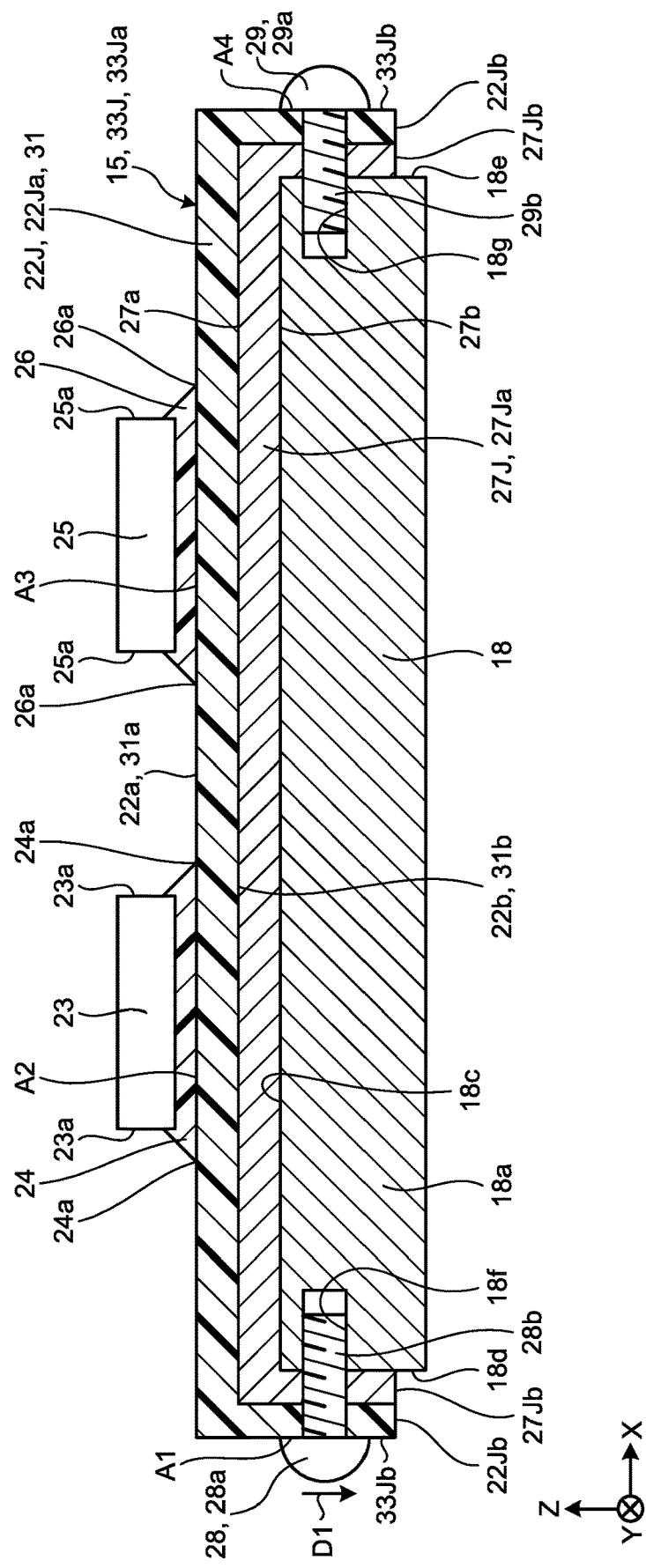
FIG. 18 is a sectional view along XVIII-XVIII of FIG. 17.

FIG. 17 is an exemplary and schematic plan view of a part of a FPC assembly 15 and a carriage 18 of a twelfth embodiment. FIG. 18 is a sectional view along XVIII-XVIII of FIG. 17. In the twelfth embodiment, the FPC assembly 15 includes an assembly 33J including an FPC 22J and a plate 27J instead of the assembly 33 including the FPC 22 and the plate 27 of the first embodiment.

The FPC 22J, the plate 27J, and the assembly 33J include bases 22Ja, 27Ja, and 33Ja and pairs of extensions 22Jb, 27Jb, and 33Jb respectively. The bases 22Ja, 27Ja, and 33Ja are laminated on the base 18c of the carriage 18, and the pairs of extensions 22Jb, 27Jb, and 33Jb are placed on the lateral faces 18d and 18e of the carriage 18.

The first IC 23, the first underfill 24, the second IC 25, and the second underfill 26 are disposed in the base 22Ja of the FPC 22J, and the base 22Ja includes the first regions A2 and A3. The pair of extensions 22Jb of the FPC 22J include the first regions A1 and A3 respectively.

The base 27Ja of the plate 27J is fixed onto the base 22Ja of the FPC 22J. The pair of extensions 27Jb of the plate 27J is fixed onto the pair of extensions 22Jb respectively.

The base 33Ja of the assembly 33J includes the bases 22Ja and 27Ja of the FPC 22J and the plate 27J. The pair of extensions 33Jb of the assembly 33J includes the pair of extensions 22Jb and 27Jb of the FPC 22J and the plate 27J. That is, the base 33Ja of the assembly 33 includes the FPC 22J and the plate 27J, on which the first IC 23 and the second IC 25 are mounted. The pair of extensions 33Jb of assembly 33J extends in the orthogonal direction D1, and is fixed to the carriage 18.

As described above, in this embodiment, the assembly 33J includes the base 33Ja which includes the FPC 22J and the plate 27J, on which the first IC 23 and the second IC 25 are mounted, and the extensions 33Jb which extend in the orthogonal direction D1 and is fixed to the carriage 18. Thus, the distance between the first region A1 and the first region A2 and the distance between the first region A3 and the first region A4 can be elongated, compared with the assembly 33J in which the base 33Ja is fixed to the carriage 18. This can inhibit the thermal deformation of the base 33Ja of the assembly 33J. Thereby, the stress concentration on the wires 32a laid on the base 33Ja can be reduced.

Thirteenth Embodiment

Figure 19:
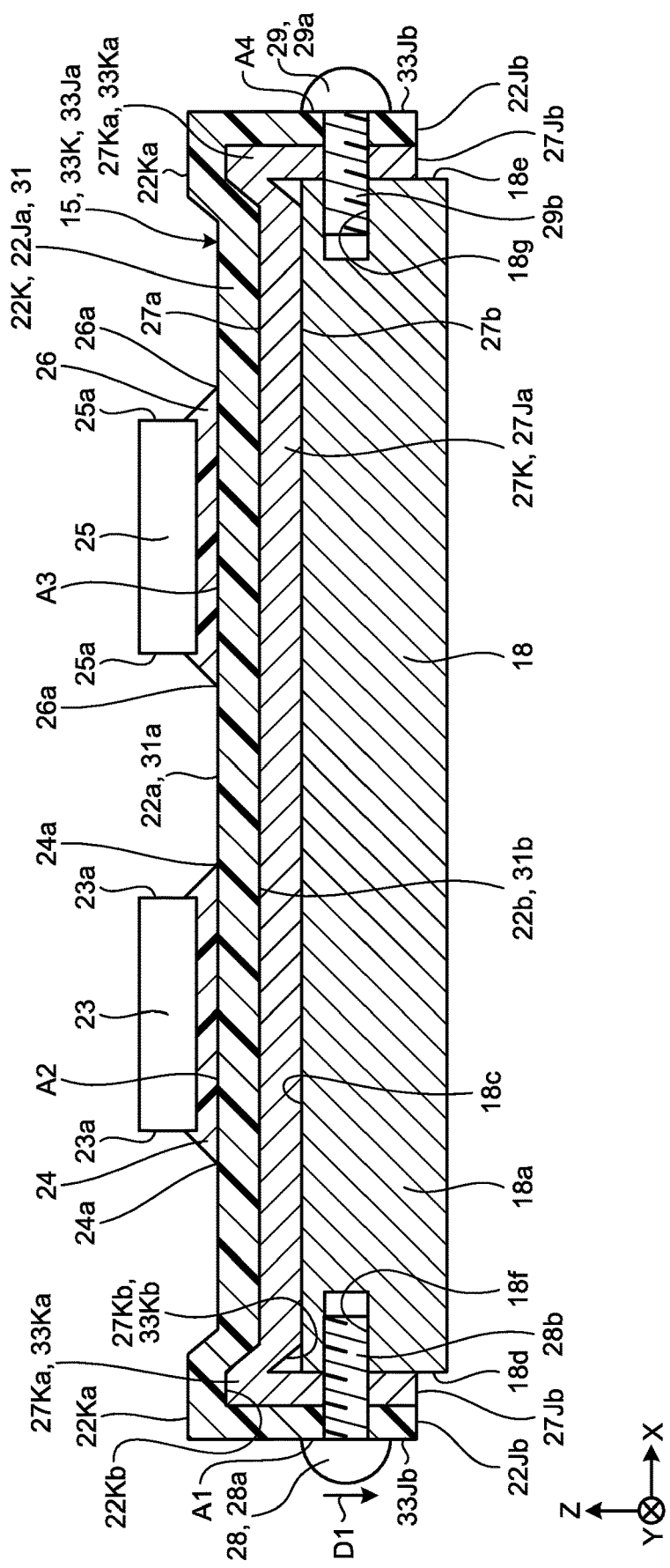
FIG. 19 is an exemplary and schematic sectional view of an FPC assembly and a carriage of a thirteenth embodiment, and corresponds to FIG. 18.

FIG. 19 is an exemplary and schematic sectional view of a FPC assembly 15 and a carriage 18 of a thirteenth embodiment, and corresponds to the FIG. 18. In the thirteenth embodiment, the FPC assembly 15 includes an assembly 33K including an FPC 22K and a plate 27K instead of the assembly 33J including the FPC 22J and the plate 27J of the twelfth embodiment.

As with the FPC 22J, the plate 27J, and the assembly 33J, the FPC 22K, the plate 27K, and the assembly 33K include the bases 22Ja, 27Ja, and 33Ja, and the pairs of extensions 22Jb, 27Jb, and 33Jb respectively. However, the FPC 22K, the plate 27K, and the assembly 33K of this embodiment further include convex bends 22Ka, 27Ka, and 33Ka respectively.

The bends 22Ka, 27Ka, and 33Ka have a convex shape in the Y direction, and are provided inside with concaves 22Kb, 27Kb, and 33Kb opening in the opposite direction of the Y direction. The bends 22Ka, 27Ka, and 33Ka deform along with the thermal expansion of the bases 22Ja, 27Ja, and 33Ja and the pairs of extensions 22Jb, 27Jb, and 33Jb.

As described above, in this embodiment, the FPC 22K, the plate 27K, and the assembly 33K include the convex bends 22Ka, 27Ka, and 33Ka respectively. This can further elongate the distance between the first region A1 and the first region A2 and the distance between the first region A3 and the first region A4. It is thus possible to inhibit the thermal deformation of the base 33Ja of the assembly 33K. Thereby, the stress concentration on the wires 32a laid on the base 33Ja can be reduced.

Fourteenth Embodiment

Figure 20:
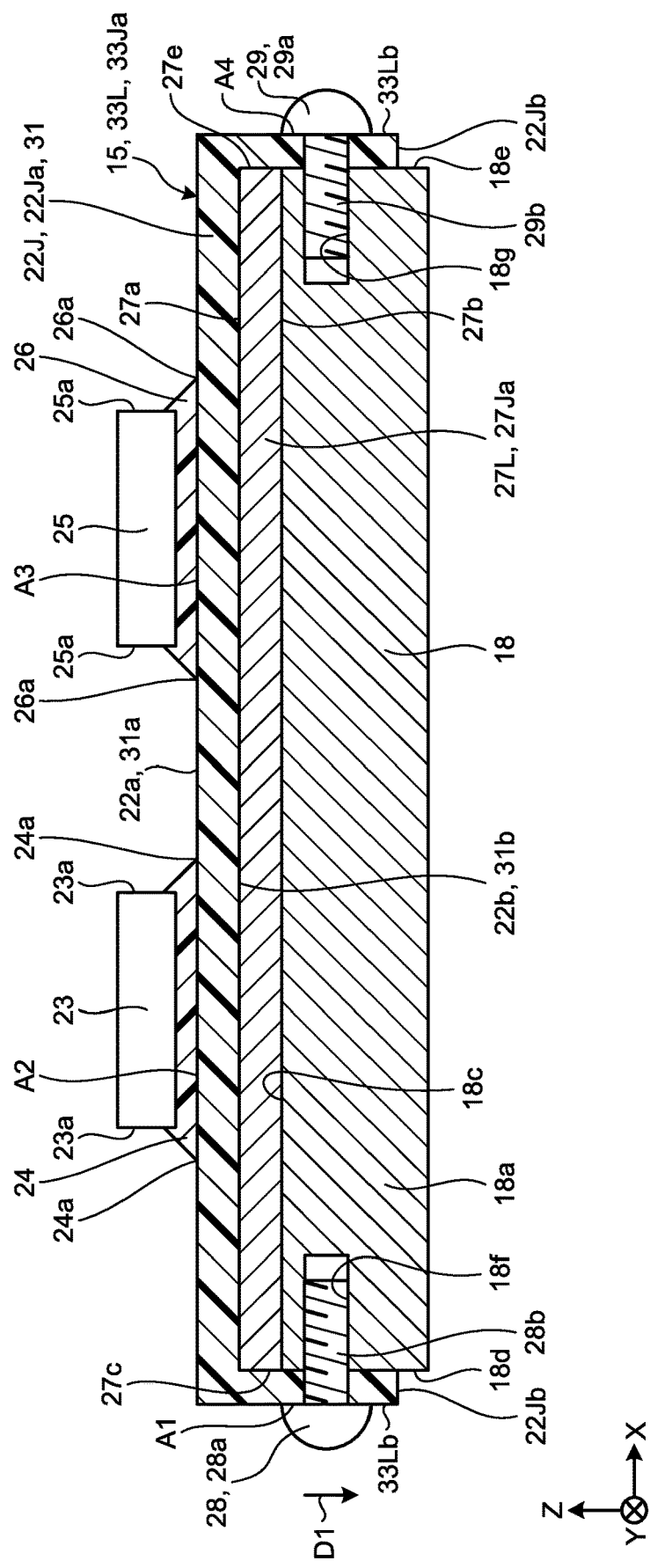
FIG. 20 is an exemplary and a schematic sectional view of an FPC assembly and a carriage of a fourteenth embodiment, and corresponds to FIG. 18.

FIG. 20 is an exemplary and schematic sectional view of a FPC assembly 15 and a carriage 18 of a fourteenth embodiment, and corresponds to FIG. 18. In the fourteenth embodiment, the FPC assembly 15 includes an assembly 33L including the FPC 22J and a plate 27L instead of the assembly 33J including the FPC 22J and the plate 27J of the twelfth embodiment.

The plate 27L includes the base 27Ja but includes no pair of extensions 27Jb. Thus, the pair of extensions 33Jb of the assembly 33J are formed of the pair of extensions 22Jb of the FPC 22J. That is, the plate 27L is not fixed to the carriage 18 with the first screw 28 and the second screw 29.

As described above, in this embodiment, the plate 27L is not fixed to the carriage 18 with the first screw 28 and the second screw 29. The plate 27L is thus less restricted from becoming extended in the X direction by the first screw 28 and the second screw 29. That is, the plate 27L can be extended in the X direction. This makes it possible to restrict the base 33Ja of the assembly 33K from thermally deforming in convex form. Thereby, the stress concentration on the wires 32a laid on the base 33Ja can be reduced.

Fifteenth Embodiment

Figure 21:
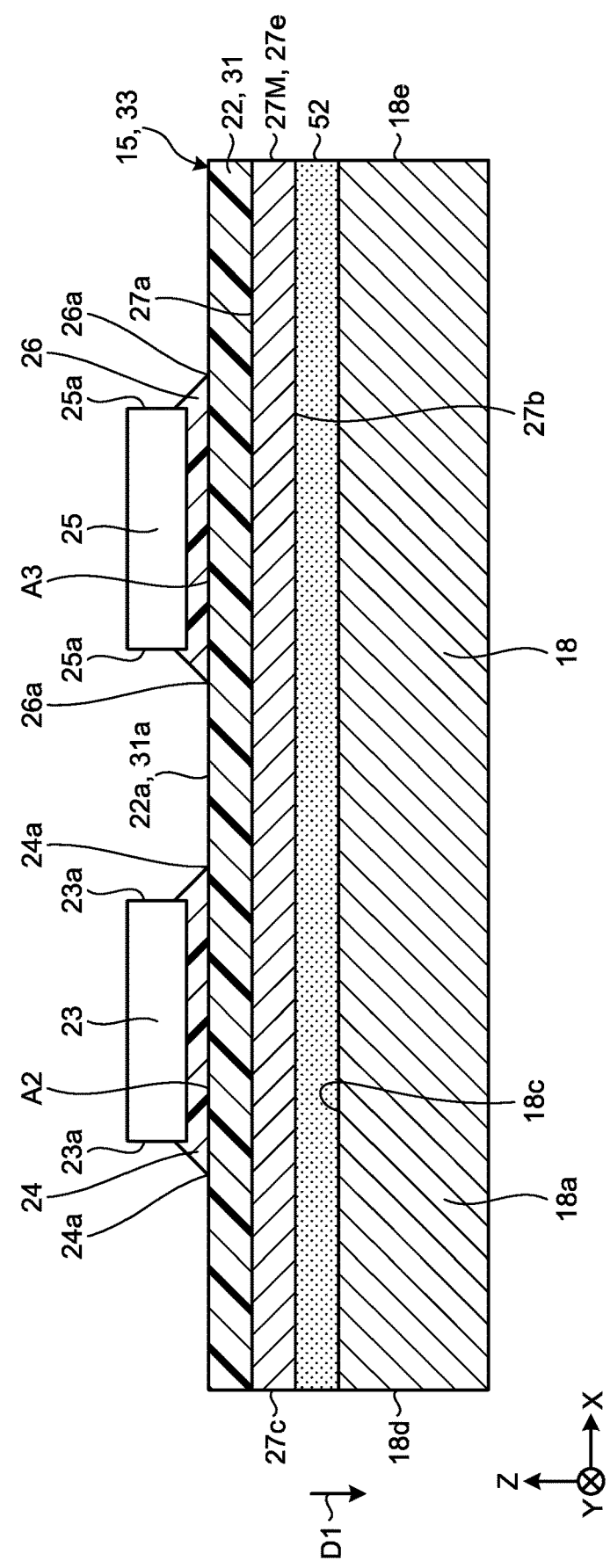
FIG. 21 is an exemplary and a schematic sectional view of an FPC assembly and a carriage of a fifteenth embodiment, and corresponds to FIG. 18.

FIG. 21 is an exemplary and schematic sectional view of a FPC assembly 15 and a carriage 18 of a fifteenth embodiment, and corresponds to FIG. 18. The fifteenth embodiment uses an adhesive 52 instead of the first screw 28 and the second screw 29 of the first embodiment. In addition, the FPC assembly 15 includes a plate 27M instead of the plate 27.

The adhesive 52 lies between the second face 27b of the plate 27M and the base 18c of the carriage 18 to fix the plate 27M and the FPC 22 to the carriage 18. The adhesive 52 forms a layer across approximately the entire region between the second face 27b of the plate 27M and the base 18c of the carriage 18. That is, the adhesive 52 lies over the first IC 23 and the second IC 25 (electronic components) with the FPC 22 and the plate 27M interposed in-between. The adhesive 52 may be provided in part of the area between the second face 27b of the plate 27M and the base 18c of the carriage 18. In addition, the plate 27M is provided with no opening 34.

As described above, in this embodiment, the plate 27M is fixed onto the second surface 22b, and is fixed to the carriage 18 with the adhesive 52. Thus, heat generated from the first IC 23 and the second IC 25 is transferred to the adhesive 52 through the plate 27M, and for example, the adhesive 52 is thermally expanded in the X direction along with the plate 27M, or is pulled by the plate 27M and stretches in the X direction. This can inhibit the plate 27 from deforming in convex form in the X direction, reducing the stress concentration on the wires 32a.

The first to fifteenth embodiments can be combined when appropriate. For example, the plates 27J to 27M of the twelfth to fifteenth embodiments may be provided with the openings 34, 34A1, 34A2, 34B1, 34B2, 34B3, 34C, 34D, 34E1, 34E2, 34F1, 34F2, 34G1, 34G2, 34H1, 34H2, 34I1, and 34I2 of the first to eleventh embodiments.

The above embodiments have described either or both of the first IC 23 and the second IC 25 as electronic components to be mounted on the FPCs 22, 22J, and 22K, but they are not limited thereto. The number of electronic components may be three or more. In addition, the electronic components may be various electronic components other than the ICs.

The above embodiments have described the example of the single plate 27 or 27I to 27M, but the plate is not limited thereto. For example, the plates 27 and 27I to 27M may be divided. That is, a plurality of plates may be provided. In this case, no plate needs to be disposed in the regions of the FPCs 22, 22J, and 22K uncovered with the plate 27.

The above embodiments described the HDD 11 as an example of electronic device, but the electronic device is not limited thereto. For example, the electronic device may be a computer or the like.

In addition, the above embodiments have described the example of joining the FPCs 22, 22J, and 22K with the carriage 18 with the first screw 28 and the second screw 29, but the FPCs 22, 22J, and 22K are not limited thereto. For example, the FPCs 22, 22J, and 22K may be joined with the carriage 18 by soldering with pins. Specifically, pins of the carriage 18 may be inserted into the through holes in the FPCs 22, 22J, and 22K, joining the pins and the FPCs 22, 22J, and 22K together around the pins by soldering. The pins may be integrally molded with the carriage 18, or may be fitted into the female screws 18f and 18g of the carriage 18. In this case, The soldered regions of the FPCs 22, 22J, and 22K are restrained by the carriage 18 through the solder and the pins. That is, the soldered regions of the FPCs 22, 22J, and 22K will be the first regions.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic device, comprising:
a support member;
a flexible printed-wiring board that includes a first face, a second face opposite the first face, and wiring, and is supported by the support member;
one or more electronic components that are mounted on the first face, and are electrically connected to the wiring; and
a plate that is fixed onto the second face,
wherein the flexible printed-wiring board includes a plurality of first regions, on which the one or more electronic components are mounted or to which a member secured on the support member is fixed,
the plate is provided with an opening between two first regions of the plurality of first regions when viewed from a direction orthogonal to the first face,
at least part of the wiring includes an extension extending from one of the first regions toward another one of the first regions, and
the opening is aligned with the extension in the orthogonal direction.

2. The electronic device according to claim 1,
wherein the opening extends outward from between two first regions on which two electronic components are mounted, respectively, when the plate is viewed from the orthogonal direction.

3. The electronic device according to claim 1,
wherein the opening is located around the first regions to which the member is fixed, when the plate is viewed from the orthogonal direction.

4. The electronic device according to claim 1,
wherein the opening includes a plurality of first parts and a second part that connects the first parts together, and
when the plate is viewed from the orthogonal direction, the first parts are located between two first regions, and at least one of the first regions is located between the first parts.

5. The electronic device according to claim 1,
wherein the member is a fastener that includes a head and a shaft, the head that is secured on the first face, the shaft that is connected to the head, and penetrates through the first face and the second face to be fixed to the support member, and
the head is located in the opening when the plate is viewed from the orthogonal direction.

6. The electronic device according to claim 1,
wherein the member includes two members, and
the first region on which the electronic component is mounted is located between two first regions to which the two members are fixed, respectively, when the plate is viewed from the orthogonal direction.

7. The electronic device according to claim 1,
wherein the opening is located between two first regions on which two electronic components are mounted, when the plate is viewed from the orthogonal direction.

8. The electronic device according to claim 1,
wherein the opening is located between one of the first regions to which the member is fixed and another one of the first regions on which the electronic component is mounted, when the plate is viewed from the orthogonal direction.

9. The electronic device according to claim 1,
wherein the opening is a through hole.

10. The electronic device according to claim 1,
wherein the opening is a cutout.

11. The electronic device according to claim 1,
wherein the opening includes a first part and a second part intersecting with the first part.

12. The electronic device according to claim 1,
wherein the member includes two members, and
the first regions on which the electronic components are mounted are located, between two first regions to which the two members are fixed, respectively, closer to one of the two first regions, when the plate is viewed from the orthogonal direction.

13. An electronic device, comprising:
a support member;
a flexible printed-wiring board that includes a first face, a second face opposite the first face, and wiring, and is supported by the support member;
one or more electronic components that are mounted on the first face, and are electrically connected to the wiring; and
a plate that is fixed onto the second face,
wherein the flexible printed-wiring board includes a plurality of first regions, on which the one or more electronic components are mounted or to which a member secured on the support member is fixed,
the plate is provided with an opening between two first regions of the plurality of first regions when viewed from a direction orthogonal to the first face,
the member is a fastener that includes a head and a shaft, the head that is secured on the first face, the shaft that is connected to the head, and penetrates through the first face and the second face to be fixed to the support member,
the plate includes
a first reinforcement that is placed on the first regions on which the electronic components are mounted,
a second reinforcement held between the head and the support member while surrounding the shaft, and
a connection that partially connects the first reinforcement and the second reinforcement together, and
the opening is located between the first reinforcement and the second reinforcement.

14. An electronic device, comprising:
a support member;
a flexible printed-wiring board that includes a first face, a second face opposite the first face, and wiring, and is supported by the support member;
one or more electronic components that are mounted on the first face, and are electrically connected to the wiring; and
a plate that is fixed onto the second face, and forms an assembly with the flexible printed-wiring board,
wherein the assembly includes a base and an extension, the base that includes the flexible printed-wiring board and the plate, on which the electronic component is mounted, the extension that extends in a direction intersecting with the first face of the base and is fixed to the support member.

15. The electronic device according to claim 14,
wherein the assembly includes a convex bend between the extension and the base.

16. The electronic device according to claim 14,
wherein the extension includes the flexible printed-wiring board.

* * * * *